(12) United States Patent
Dotu et al.

(10) Patent No.: US 11,811,417 B1
(45) Date of Patent: Nov. 7, 2023

(54) COUPLING HARNESS WITH ORIENTATION DETECTION AND LOGIC CORRECTION

(71) Applicant: Geotab Inc., Oakville (CA)

(72) Inventors: Daniel Bernal Dotu, Madrid (ES); Lara Aguilera Escobar, Madrid (ES); Cristian Luis Ochoa Citadini, Madrid (ES)

(73) Assignee: Geotab Inc., Oakville (CA)

( * ) Notice: Subject to any disclaimer, the term of this patent is extended or adjusted under 35 U.S.C. 154(b) by 0 days.

(21) Appl. No.: 18/207,765

(22) Filed: Jun. 9, 2023

(51) Int. Cl.
| | |
|---|---|
| *H03M 1/06* | (2006.01) |
| *H04L 12/40* | (2006.01) |
| *H03M 1/12* | (2006.01) |
| *H04M 3/00* | (2006.01) |
| *G06F 17/00* | (2019.01) |

(52) U.S. Cl.
CPC ............ *H03M 1/0617* (2013.01); *H03M 1/12* (2013.01); *H04L 12/40* (2013.01); *G06F 17/00* (2013.01); *H04L 2012/40215* (2013.01); *H04M 3/00* (2013.01)

(58) Field of Classification Search
CPC ....... H03M 1/0617; H03M 1/12; H04L 12/40; H04M 3/00; G06F 17/00
See application file for complete search history.

(56) References Cited

U.S. PATENT DOCUMENTS

| | | |
|---|---|---|
| 6,512,465 B2 | 1/2003 | Flick |
| 6,741,187 B2 | 5/2004 | Flick |
| 6,744,384 B2 | 6/2004 | Flick |
| 6,756,885 B1 | 6/2004 | Flick |
| 6,784,809 B2 | 8/2004 | Flick |
| 6,798,356 B2 | 9/2004 | Flick |
| 6,803,861 B2 | 10/2004 | Flick |
| 6,888,495 B2 | 5/2005 | Flick |
| 6,957,133 B1 | 10/2005 | Hunt et al. |
| 6,972,667 B2 | 12/2005 | Flick |
| 7,257,396 B2 * | 8/2007 | Olsen .................. G07C 5/0858 455/420 |
| 7,647,147 B2 | 1/2010 | Fortin et al. |
| 7,671,727 B2 | 3/2010 | Flick |
| 8,032,278 B2 | 10/2011 | Flick |
| 9,754,426 B2 | 9/2017 | Meyer et al. |
| 9,886,800 B2 | 2/2018 | Groß |
| 10,255,575 B2 | 4/2019 | Warkentin et al. |
| 11,140,236 B2 | 10/2021 | Davis et al. |
| 11,310,069 B2 | 4/2022 | Xiao et al. |

(Continued)

FOREIGN PATENT DOCUMENTS

CN  115442174 A  12/2022

OTHER PUBLICATIONS

"Extended European Search Report for European Application No. 23 382 502.5 , dated Aug. 30, 2023, 8 pages."

Primary Examiner — Joseph J Lauture
(74) Attorney, Agent, or Firm — Sherif A. Abdel-Kader

(57) ABSTRACT

A coupling harness, including a coupling clamp, for capturing a coupled signal from signal lines is provided. The coupling harness has an orientation detector that determines whether the coupled signal needs to be complemented based on an orientation of the coupling clamp relative to the signal lines. A logic corrector complements the coupled signal based on an output of the orientation detector. Advantageously, signals may be coupled correctly from signal lines regardless of the orientation of the coupling clamp.

20 Claims, 19 Drawing Sheets

(56) References Cited

U.S. PATENT DOCUMENTS

| | | |
|---|---|---|
| 11,542,001 B1 | 1/2023 | Parodi et al. |
| 2018/0182182 A1 | 6/2018 | Meyer et al. |
| 2018/0351765 A1 | 12/2018 | Aarey Premanath |
| 2022/0014601 A1 | 1/2022 | Davis et al. |
| 2022/0044500 A1 | 2/2022 | Yang et al. |
| 2022/0237958 A1 | 7/2022 | Tzamaloukas et al. |

* cited by examiner

COUPLING HARNESS WITH ORIENTATION DETECTION AND LOGIC CORRECTION

RELATED APPLICATIONS

This application claims priority from European patent application EP23382502.5 filed on May 29, 2023, the contents of which are herein incorporated by reference in their entirety.

FIELD

The present disclosure generally relates to machine telematics, and more specifically to a coupling harness with orientation detection and logic correction.

BACKGROUND

A telematics system may gather asset data using a telematics device. The telematics device may be integrated into or located onboard the asset. The asset may be a vehicle ("vehicular asset") or some stationary equipment. The telematics device may collect the asset data from the asset through a data connection with the asset via an interface port. In the case of a vehicular asset, the telematics device may gather the asset data through an onboard diagnostic port (OBD). Additionally, the telematics device may gather sensor data pertaining to the asset via sensors on the telematics device. For example, the telematics device may have temperature and pressure sensors, inertial measurement units (IMU), optical sensors, and the like. Furthermore, the telematics device may gather location data pertaining to the asset from a location module on the telematics device. The gathered asset data, sensor data and location data may be received and recorded by a technical infrastructure of the telematics system, such as a telematics server, and used in the provision of fleet management tools, for telematics services, or for further data analysis.

Some assets do not have an interface port through which asset data may be gathered. Other assets may have a gateway that blocks much of the asset data making it impossible for a telematics device to capture such asset data via the interface port of the asset. In both cases, a telematics device needs to capture the asset data via other means.

SUMMARY

In one aspect of the present disclosure, there is provided a method in a coupling harness. The method comprises producing by a coupling clamp a first coupled signal from a first signal line and a second coupled signal from a second signal line, converting the first coupled signal and the second coupled signal to a digital signal, determining from the digital signal an orientation of the coupling clamp in relation to the first signal line and the second signal line, and generating a corrected digital signal from the digital signal based on the orientation.

The method may further comprise removing common mode noise from the first coupled signal and the second coupled signal prior to the converting.

The method may further comprise biasing the first coupled signal and the second coupled signal prior to the converting.

The method may further comprise inputting the corrected digital signal into a transceiver for converting the corrected digital signal to a first signal corresponding to the first coupled signal and a second signal corresponding to the second coupled signal.

The first signal line and the second signal line may carry a differential voltage signal.

In some embodiments, the first signal line and the second signal line are Controller Area Network (CAN) signal lines, the first signal line carries one of a CAN Low (CANL) signal and a CAN High (CANH) signal, and the second signal line carries another one of the CANL signal and the CANH signal.

Producing the first coupled signal may comprise coupling between a first coupling element in the coupling clamp and the first signal line and producing the second coupled signal may comprise coupling between a second coupling element in the coupling clamp and the second signal line.

In some embodiments, the coupling comprises capacitive coupling, the first coupling element comprises a first coupling conductor, and the second coupling element comprises a second coupling conductor.

Converting the first coupled signal and the second coupled signal to the digital signal may comprise applying the first coupled signal to an inverting input of a first analog comparator, applying the second coupled signal to a non-inverting input of the first analog comparator, and taking an output of the first analog comparator to be the digital signal.

Determining the orientation of the coupling clamp may comprise obtaining an average level of the digital signal and comparing the average level to an average level threshold.

Determining the orientation of the coupling clamp further may comprise determining that the orientation of the coupling clamp is a first orientation when the average level is smaller than the average level threshold, and determining that the orientation of the coupling clamp is a second orientation when the average level is greater than the average level threshold.

Determining the orientation of the coupling clamp further may comprise outputting a logic correction signal based on the orientation.

Obtaining the average level may comprise passing the digital signal through a low pass filter.

Comparing the average level to the average level threshold may comprise inputting the average level to an inverting input of a second analog comparator and inputting the average level threshold to a non-inverting input of the second analog comparator.

Generating the corrected digital signal from the digital signal based on the orientation may comprise generating a logic inverted signal of the digital signal when the orientation is a first orientation and outputting the digital signal as the corrected digital signal when the orientation is a second orientation.

In another aspect of the present disclosure, there is provided a coupling harness. The coupling harness comprises a coupling clamp for capturing a first coupled signal from a first signal line and a second coupled signal from a second signal line, a level converter for converting the first coupled signal and the second coupled signal to a digital signal, an orientation detector for determining, from the digital signal, an orientation of the coupling clamp in relation to the first signal line and the second signal line, and a logic corrector for generating a corrected digital signal from the digital signal based on the orientation.

The coupling harness may further comprise a transceiver for converting the corrected digital signal to a first signal corresponding to the first coupled signal and a second signal corresponding to the second coupled signal.

The first signal line and the second signal line may carry a differential voltage signal.

The first signal line and the second signal line may be Controller Area Network (CAN) signal lines, the first signal line may carry one of a CAN Low (CANL) signal and a CAN High (CANH) signal, and the second signal line may carry another one of the CANL signal and the CANH signal.

The coupling clamp may comprise a first coupling element for capturing the first coupled signal by coupling with the first signal line and a second coupling element for capturing the second coupled signal by coupling with the second signal line.

The first coupling element may comprise a first coupling conductor, the second coupling element may comprises a second coupling conductor, and the coupling may comprise capacitive coupling.

The level converter may comprise a first analog comparator having a positive feedback, the first coupled signal may be input into an inverting input of the first analog comparator, the second coupled signal may be input into a non-inverting input of the first analog comparator, the digital signal is taken at an output of the first analog comparator.

The orientation detector may comprise a filter to obtaining an average level of the digital signal and a second analog comparator for comparing the average level to an average level threshold.

The orientation detector may output a logic correction signal.

The logic corrector may comprise an exclusive OR gate having a first input connected to the logic correction signal and a second input connected to the digital signal.

BRIEF DESCRIPTION OF THE DRAWINGS

Exemplary non-limiting embodiments of the present disclosure are described with reference to the accompanying drawings in which.

DETAILED DESCRIPTION

Telematics System

Figure 1:
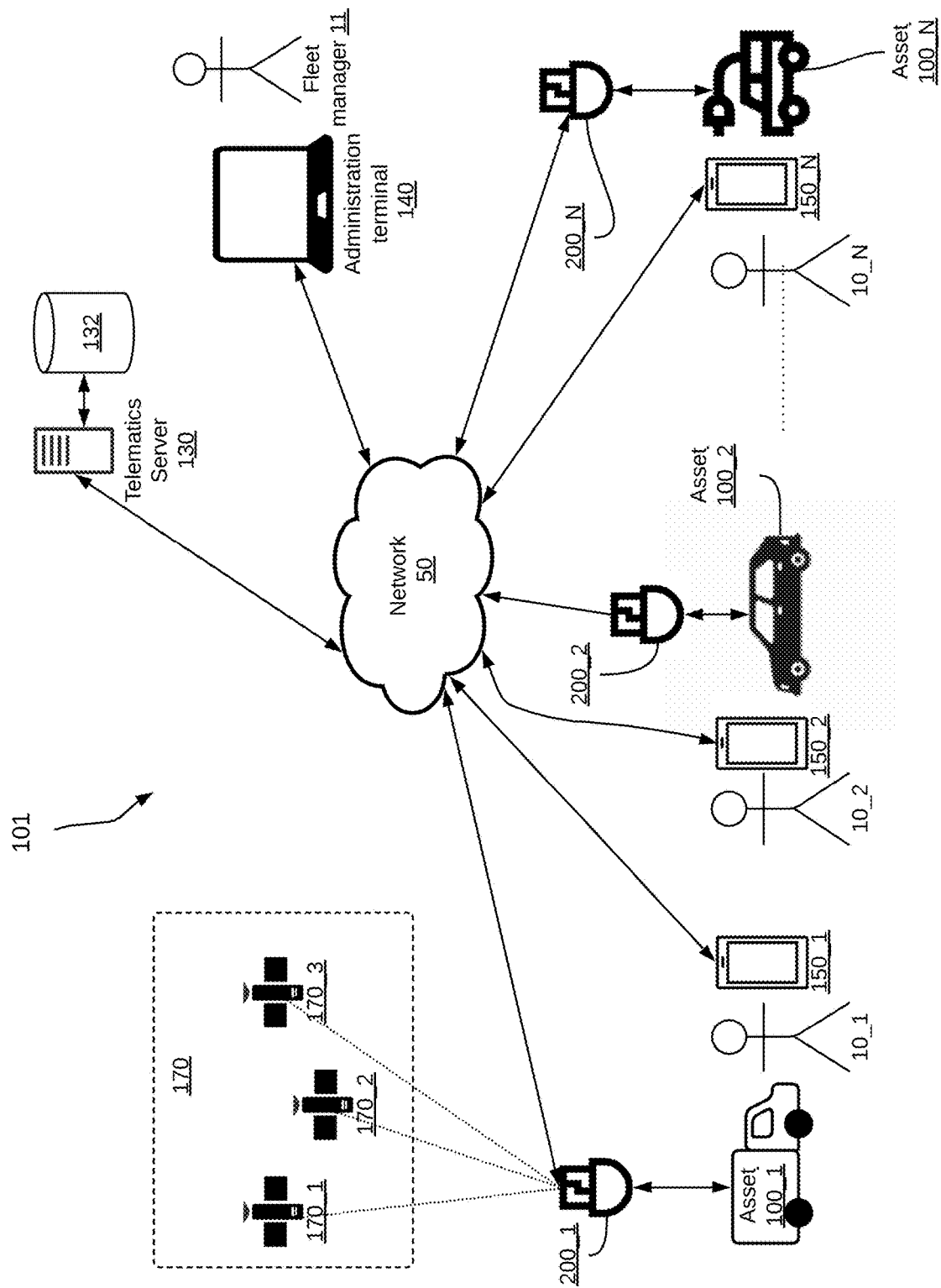
FIG. 1 is a schematic diagram of a telematics system including a plurality of telematics devices coupled to a plurality of assets.

A large telematics system may collect data from a high number of assets, either directly or through telematic devices. A telematics device may refer to a self-contained device installed at an asset, or a telematics device that is integrated into the asset itself. In either case, it may be said that telematics data is being captured or gathered by the telematics device. FIG. 1 shows a high-level block diagram of a telematics system 101. The telematics system 101 includes a telematics server 130, (N) telematics devices shown as telematics device 200_1, telematics device 200_2 . . . through telematics device 200_N ("telematics device 200"), a network 50, administration terminal 140, and operator terminals 150_1, 150_2 . . . through 150_N ("the operator terminals 150"). FIG. 1 also shows a plurality of (N) assets named as asset 100_1, asset 100_2 . . . asset 100_N ("asset 100") coupled to the telematics device 200_1, telematics device 200_2 . . . telematics device 200_N, respectively. Additionally, FIG. 1 shows a plurality of satellites 170_1, 170_2 and 1703 ("the satellites 170") in communication with the telematics devices 200 for facilitating navigation.

The assets 100 shown are in the form of vehicles. For example, the asset 100_1 is shown as a truck, which may be part of a fleet that delivers goods or provides services. The asset 100_2 is shown as a passenger car that typically runs on an internal combustion engine (ICE). The asset 100_3 is shown as an electric vehicle (EV). Other types of vehicles, which are not shown, are also contemplated in the various embodiments of the present disclosure, including but not limited to, farming vehicles, construction vehicles, military vehicles, and the like.

The telematics devices 200 are electronic devices which are coupled to assets 100 and configured to capture asset data from the assets 100. For example, in FIG. 1 the telematics device 200_1 is coupled to the asset 100_1. Similarly, the telematics device 200_2 is coupled to the asset 100_2 and the telematics device 200_3 is coupled to the asset 100_3. The components of a telematics device 200 are explained in further detail with reference to FIG. 2.

The network 50 may be a single network or a combination of networks such as a data cellular network, the Internet, and other network technologies. The network 50 may provide connectivity between the telematics devices 200 and the telematics server 130, between the administration terminal 140 and the telematics server 130, and between the operator terminals 150 and the telematics server 130.

The telematics server 130 is an electronic device executing machine-executable programming instructions which enable the telematics server 130 to store and analyze telematics data. The telematics server 130 may be a single computer system or a cluster of computers. The telematics server 130 may be running an operating system such as Linux, Windows, Unix, or any other equivalent operating system. Alternatively, the telematics server 130 may be a software component hosted on a cloud service, such as Amazon Web Service (AWS). The telematics server 130 is connected to the network 50 and may receive telematics data from the telematics devices 200. The telematics server 130 may have a plurality of software modules for performing data analysis and analytics on the telematics data to obtain useful asset information about the assets 100. The telematics server 130 may be coupled to a telematics database 132 for storing telematics data and/or the results of the analytics which are related to the assets 100. The asset information stored may include operator information about the operators 10 corresponding to the assets. The telematics server 130 may communicate the asset data and/or the operator information pertaining to an asset 100 to one or more of: the administration terminal 140, and the operator terminal 150.

The satellites 170 may be part of a global navigation satellite system (GNSS) and may provide location information to the telematics devices 200. The location information may be processed by a location module on the telematics device 200 to provide location data indicating the location of the telematics device 200 (and hence the location of the asset 100 coupled thereto). A telematics device 200 that can periodically report an asset's location is often termed an "asset tracking device".

The administration terminal 140 is an electronic device, which may be used to connect to the telematics server 130 to retrieve data and analytics related to one or more assets 100 or to issue commands to one or more telematics device 200 via the telematics server 130. The administration terminal 140 is shown as a laptop computer, but may also be a desktop computer, a tablet (not shown), or a smartphone. The administration terminal 140 may run a web browser or a custom application which allows retrieving data and analytics, pertaining to one or more assets 100, from the telematics server 130 via a web interface of the telematics server 130. The administration terminal 140 may also be used to issue commands to one or more telematics device 200 via the telematics server 130. A fleet manager 11 may communicate with the telematics server 130 using the administration terminal 140. In addition to retrieving data and analytics, the administration terminal 140 allows the fleet manager 11 to set alerts and geofences for keeping track of the assets 100, receiving notifications of deliveries, and so on.

The operator terminals 150 are electronic devices, such as smartphones or tablets. The operator terminals 150 are used by operators 10 (for example, vehicle drivers) of the assets 100 to both track and configure the usage of the assets 100. For example, as shown in FIG. 1, the operator 10_1 has the operator terminal 150_1, the operator 10_2 has the operator terminal 150_2, and the operator 10_N has the operator terminal 150_N. Assuming the operators 10 all belong to a fleet of vehicles, each of the operators 10 may operate any of the assets 100. For example, FIG. 1 shows that the operator 10_1 is associated with the asset 100_1, the operator 10_2 is associated with the asset 100_2, and the operator 10_N is associated with the asset 100_N. However, any operator 10 may operate any asset 100 within a particular group of assets, such as a fleet. The operator terminals 150 are in communication with the telematics server 130 over the network 50. The operator terminals 150 may run at least one asset configuration application. The asset configuration application may be used by operator 10 to inform the telematics server 130 that asset 100 is currently being operated by operator 10. For example, the operator 10_2 may use an asset configuration application on the operator terminal 150_2 to indicate that the operator 10_2 is currently using the asset 100_2. The telematics server 130 updates the telematics database 132 to indicate that the asset 100_2 is currently associated with the operator 10_2. Additionally, the asset configuration application may be used to report information related to the operation duration of the vehicle, the number of stops made by the operator during their working shift, and so on. Furthermore, the asset configuration application may allow the operator to configure the telematics device 200 coupled to the asset 100 that the operator 10 is operating.

In operation, a telematics device 200 is coupled to an asset 100 to capture asset data. The asset data may be combined with location data obtained by the telematics device 200 from a location module in communication with the satellites 170 and/or sensor data gathered from sensors in the telematics device 200 or another device coupled to the telematics device 200. The combined asset data, location data, and sensor data may be termed "telematics data." The telematics device 200 sends the telematics data to the telematics server 130 over the network 50. The telematics server 130 may process, aggregate, and analyze the telematics data to generate asset information pertaining to the assets 100 or to a fleet of assets. The telematics server 130 may store the telematics data and/or the generated asset information in the telematics database 132. The administration terminal 140 may connect to the telematics server 130, over the network 50, to access the generated asset information. Alternatively, the telematics server 130 may push the generated asset information to the administration terminal 140. Additionally, the operators 10, using their operator terminals 150, may indicate to the telematics server 130 which assets 100 they are associated with. The telematics server 130 updates the telematics database 132 accordingly to associate the operator 10 with the asset 100. Furthermore, the telematics server 130 may provide additional analytics related to the operators 10 including work time, location, and operating parameters. For example, for vehicle assets, the telematics data may include turning, speeding, and braking information. The telematics server 130 can correlate the telematics data to the vehicle's driver by querying the telematics database 132. A fleet manager 11 may use the administration terminal 140 to set alerts for certain activities pertaining to the assets 100. When criteria for an alert is met, the telematics server 130 sends a message to the administration terminal 140 to notify a fleet manager 11, and may optionally send alerts to the operator terminal 150 to notify an operator 10 of the alert. For example, a vehicle driver operating the vehicle outside of a service area or hours of service may receive an alert on their operator terminal 150. A fleet manager 11 may also use the administration terminal 140 to configure a telematics device 200 by issuing commands thereto via the telematics server 130. Alerts may also be sent to the telematics device 200 to generate an alert to the driver such as a beep, a displayed message, or an audio message.

Telematics Device

Figure 2:
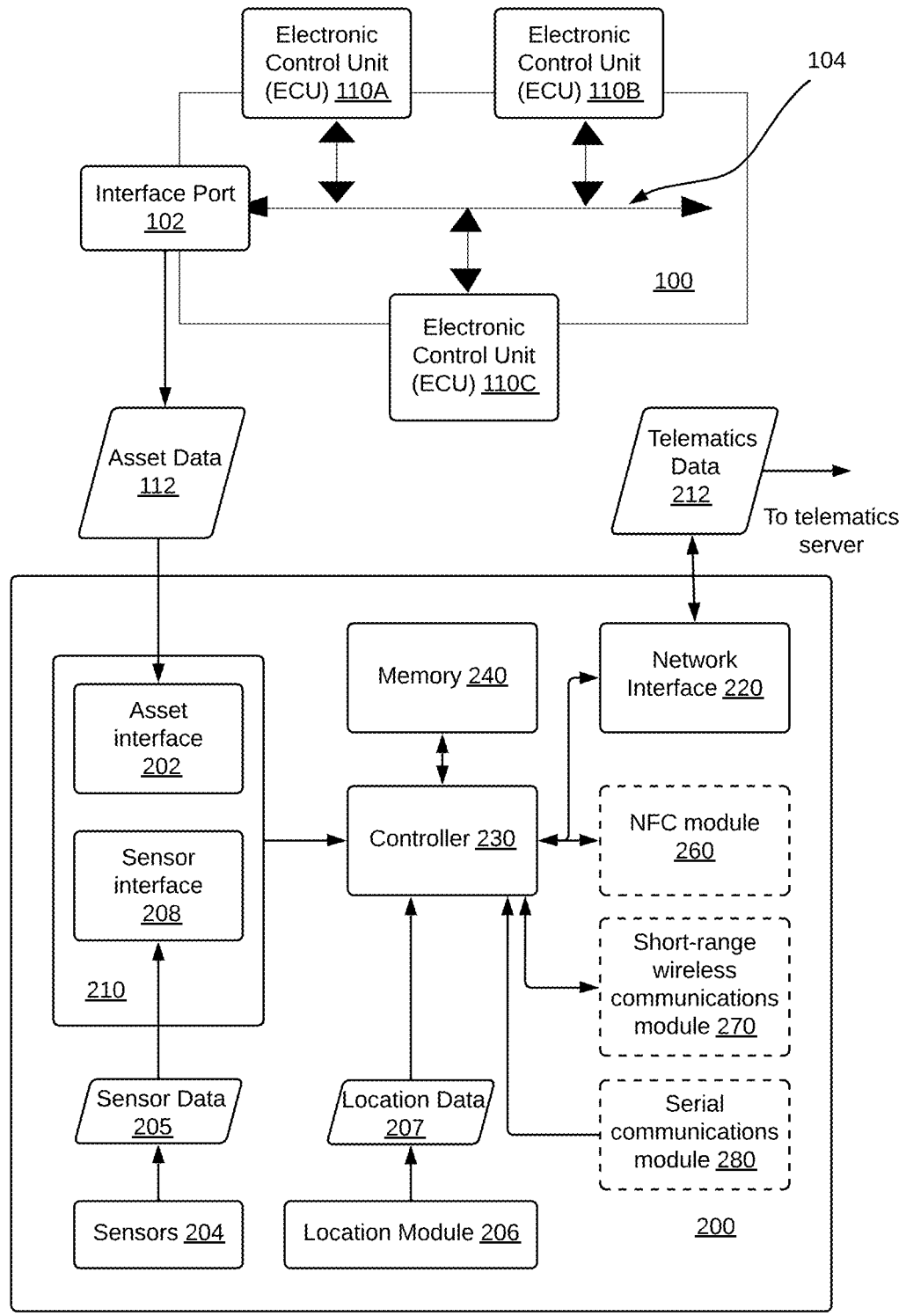
FIG. 2 is a block diagram showing a telematics device coupled to an asset.

Further details relating to the telematics device 200 and how it interfaces with an asset 100 are shown with reference to FIG. 2. FIG. 2 depicts an asset 100 and a telematics device 200 coupled thereto. Selected relevant components of each of the asset 100 and the telematics device 200 are shown.

The asset 100 may have a plurality of electronic control units (ECUs). An ECU is an electronic module which interfaces with one or more sensors for gathering information from the asset 100. For example, an engine coolant temperature (ECT) ECU may contain a temperature sensor and a controller for converting the measured temperature into digital data representative of the oil temperature. Similarly, a battery voltage ECU may contain a voltage sensor for measuring the voltage at the positive battery terminal and a controller for converting the measured voltage into digital data representative of the battery voltage. A vehicle may, for example, have around seventy ECUs. For simplicity, only a few of the ECUs 110 are depicted in FIG. 2. For example, in the depicted embodiment the asset 100 has three ECUs shown as the ECU 110A, the ECU 110B, and the ECU 110C ("the ECUs 110"). The ECU 110A, the ECU 110B, and the ECU 110C are shown to be interconnected via an asset communications bus. One example of an asset communications bus is a Controller Area Network (CAN) bus. For example, in FIG. 2 the ECUs 110 are interconnected using the CAN bus 104. The ECUs 110 send and receive information to one another in CAN data frames by placing the information on the CAN bus 104. When an ECU 110 places information on the CAN bus 104, other ECUs 110 receive the information and may or may not consume or use that information. Different protocols may be used to exchange information between the ECUs over a CAN bus. For example, ECUs 110 in trucks and heavy vehicles use the Society of Automotive Engineering (SAE) J1939 protocol to exchange information over a CAN bus 104. Most passenger vehicles use the SAE J1979 protocol, which is commonly known as On-Board Diagnostic (OBD) protocol to exchange information between ECUs 110 on their CAN bus 104. In industrial automation, ECUs use a CANOpen protocol to exchange information over a CAN bus 104. An asset 100 may allow access to information exchanged over the CAN bus 104 via an interface port 102. For example, if the asset 100 is a passenger car, then the interface port 102 is most likely an OBD-II port. Data accessible through the interface port 102 is termed the asset data 112. In some embodiments, the interface port 102 includes a power interface for providing electric power to a telematics device 200 connected thereto.

The telematics device 200 includes a controller 230 coupled to a memory 240, an interface layer 210 and a network interface 220. The telematics device 200 also includes one or more sensors 204 coupled to the interface layer and a location module 206 coupled to the controller 230. The telematics device 200 may also contain some optional components, shown in dashed lines in FIG. 2. For example, the telematics device 200 may contain one or more of: a near-field communications (NFC) module such as NFC module 260, a short-range wireless communications module 270, and a wired communications module such as a serial communications module 280. In some embodiments (not shown), the telematics device 200 may have a dedicated power source or a battery. In other embodiments, the telematics device 200 may receive power directly from the asset 100, via the interface port 102. The telematics device 200 shown is an example. Some of the components shown in solid lines may also be optional and may be implemented in separate modules. For example, some telematics devices (not shown) may not have a location module 206 and may rely on an external location module for obtaining the location data 207. Some telematics devices may not have any sensors 204 and may rely on external sensors for obtaining sensor data 205.

The controller 230 may include one or any combination of a processor, microprocessor, microcontroller (MCU), central processing unit (CPU), processing core, state machine, logic gate array, application-specific integrated circuit (ASIC), field-programmable gate array (FPGA), or similar, capable of executing, whether by software, hardware, firmware, or a combination of such, the actions performed by the controller 230 as described herein. The controller 230 may have an internal memory for storing machine-executable programming instructions to conduct the methods described herein.

The memory 240 may include read-only-memory (ROM), random access memory (RAM), flash memory, magnetic storage, optical storage, and similar, or any combination thereof, for storing machine-executable programming instructions and data to support the functionality described herein. The memory 240 is coupled to the controller 230 thus enabling the controller 230 to execute the machine-executable programming instructions stored in the memory 240 and to access the data stored therein. The memory 240 may contain machine-executable programming instructions, which when executed by the controller 230, configures the telematics device 200 for receiving asset data 112 from the asset 100 via the asset interface 203, and for receiving sensor data 205 from the sensors 204 and/or location data 207 from the location module 206 via the sensor interface 208. The memory 240 may also contain machine-executable programming instructions for combining asset data 112, sensor data 205 and location data 207 into telematics data 212. Additionally, the memory 240 may further contain instructions which, when executed by the controller 230, configures the telematics device 200 to transmit the telematics data 212 via the network interface 220 to a telematics server 130 over a network 50. In some embodiments, the memory 240 only stores data, and the machine-executable programming instructions for conducting the aforementioned tasks are stored in an internal memory of the controller 230.

The location module 206 may be a global positioning system (GPS) transceiver or another type of location determination peripheral that may use, for example, wireless network information for location determination. The location module 206 is coupled to the controller 230 and provides location data 207 thereto. The location data 207 may be in the form of a latitude and longitude, for example.

The sensors 204 may be one or more of: a temperature sensor, a pressure sensor, an optical sensor, a motion sensor such as an accelerometer, a gyroscope, or any other suitable sensor indicating a condition pertaining to the asset 100 to which the telematics device 200 is coupled. The sensors provide sensor data 205 to the controller 230 via the sensor interface 208.

The interface layer 210 may include a sensor interface 208 and an asset interface 203. The sensor interface 208 is configured for receiving the sensor data 205 from the sensors 204. For example, the sensor interface 208 interfaces with the sensors 204 and receives the sensor data 205 therefrom. The asset interface 203 receives asset data 112 from the asset 100. In the depicted embodiment, the asset interface 203 is coupled to the interface port 102 of the asset 100. The asset data 112, received at the telematics device 200, from the asset 100 may be in the form of data messages, such as CAN data frames. The asset data 112 may describe one or more of any of: a property, a state, and an operating condition of the asset 100. For example, where the asset 100 is a vehicle, the data may describe the speed at which the vehicle is traveling, a state of the vehicle (off, idle, or running), or an engine operating condition (e.g., engine oil temperature, engine revolutions-per-minutes (RPM), or a battery voltage). In addition to receiving the asset data 112, in some embodiments the asset interface 203 may also receive power from the asset 100 via the interface port 102. The interface layer 210 is coupled to the controller 230 and provides both the asset data 112 and the sensor data 205 to the controller 230.

The network interface 220 may include a cellular modem, such as an LTE-M modem, CAT-M modem, other cellular modem, Wi-Fi modem, or any other communication device configured for communication via the network 50 with which to communicate with the telematics server 130. The network interface 220 may be used to transmit telematics data 212 obtained from asset 100 to the telematics server 130 for a telematics service or other purposes. The network interface 220 may also be used to receive instructions from the telematics server 130 for configuring the telematics device 200 in a certain mode and/or requesting a particular type of the asset data 112 from the asset 100.

The NFC module 260 may be an NFC reader which can read information stored on an NFC tag. The NFC module 260 may be used to confirm the identity of the operator 10 by having the operator 10 tap an NFC tag onto the telematics device 200 such that the NFC tag is read by the NFC module 260. The information read from the NFC tag may be included in the telematics data 212 sent by the telematics device 200 to the telematics server 130.

The short-range wireless communications module 270 is a component intended for providing short-range wireless communication capability to the telematics device 200. The short-range wireless communications module 270 may be a Bluetooth™, wireless fidelity (Wi-Fi), Zigbee™, or any other short-range wireless communications module. The short-range wireless communications module 270 allows other devices to communicate with the telematics device 200 over a short-range wireless network.

The serial communications module 280 is an example of a wired communications module. The serial communications module 280 is an electronic peripheral for providing serial wired communications to the telematics device 200. For example, the serial communications module 280 may include a universal asynchronous receiver transmitter (UART) providing serial communications per the RS-232 protocol. Alternatively, the serial communications module 280 may be a serial peripheral interface (SPI) bus, or an inter-integrated circuit (I2C) bus. As another example, the serial communications module 280 may be a universal serial bus (USB) transceiver.

In operation, an ECU 110, such as the ECU 110A, the ECU 110B, or the ECU 110C communicates asset data over the CAN bus 104. The asset data exchanged between the ECUs 110, over the CAN bus 104 are accessible via the interface port 102 and may be retrieved as the asset data 112 by the telematics device 200. The controller 230 of the telematics device 200 receives the asset data 112 via the asset interface 203. The controller 230 may also receive sensor data 205 from the sensors 204 over the sensor interface 208. Furthermore, the controller 230 may receive location data 207 from the location module 206. The controller 230 combines the asset data 112 with the sensor data 205 and the location data 207 to obtain the telematics data 212. The controller 230 transmits the telematics data 212 to the telematics server 130 over the network 50 via the network interface 220. Optionally, an operator 10 may tap an NFC tag to the NFC module 260 to identify themself as the operator 10 of the asset 100. Additionally, an external peripheral, such as a GPS receiver, may connect with the telematics device 200 via the short-range wireless communications module 270 or the serial communications module 280 for providing location information thereto. In some embodiments, the telematics device 200 may receive, via the network interface 220, commands from the telematics server 130. The received commands instruct the telematics device 200 to be configured in a particular way. For example, the received commands may configure the way in which the telematics device gathers asset data 112 from the asset 100 as will be described in further detail below.

The telematics data 212 which is composed of asset data 112 gathered from the asset 100 combined with the sensor data 205 and the location data 207 may be used to derive useful data and analytics, by the telematics server 130. However, there are times when additional data, which is not provided by the asset 100, the sensors 204 or the location module 206 may be needed. The telematics device 200 may have a limited number of sensors 204 such as accelerometers or gyroscopes providing limited information about the motion of the asset 100 on which the telematics device 200 is deployed. The location module 206 may provide location and direction information. However, in some cases, more information may be needed to derive useful data and analytics pertaining to the asset 100. One example of information that is not typically provided by the telematics device 200 is video capturing data. Another example of information that is not typically provided by the telematics device 200 is any proprietary signaling provided by devices which does not follow any of the standard protocols (OBD-II, J1939 or CANOpen). Some equipment may not have a CAN bus and may provide proprietary digital and/or analog signals. Examples of such devices include industrial equipment, winter maintenance equipment such as salt spreaders, farming equipment, and the like. Additionally, the telematics device 200 may not have an NFC module 260 or a short-range wireless communications module 270 thus limiting its connectivity capabilities.

Input/Output Expander

Figure 3:
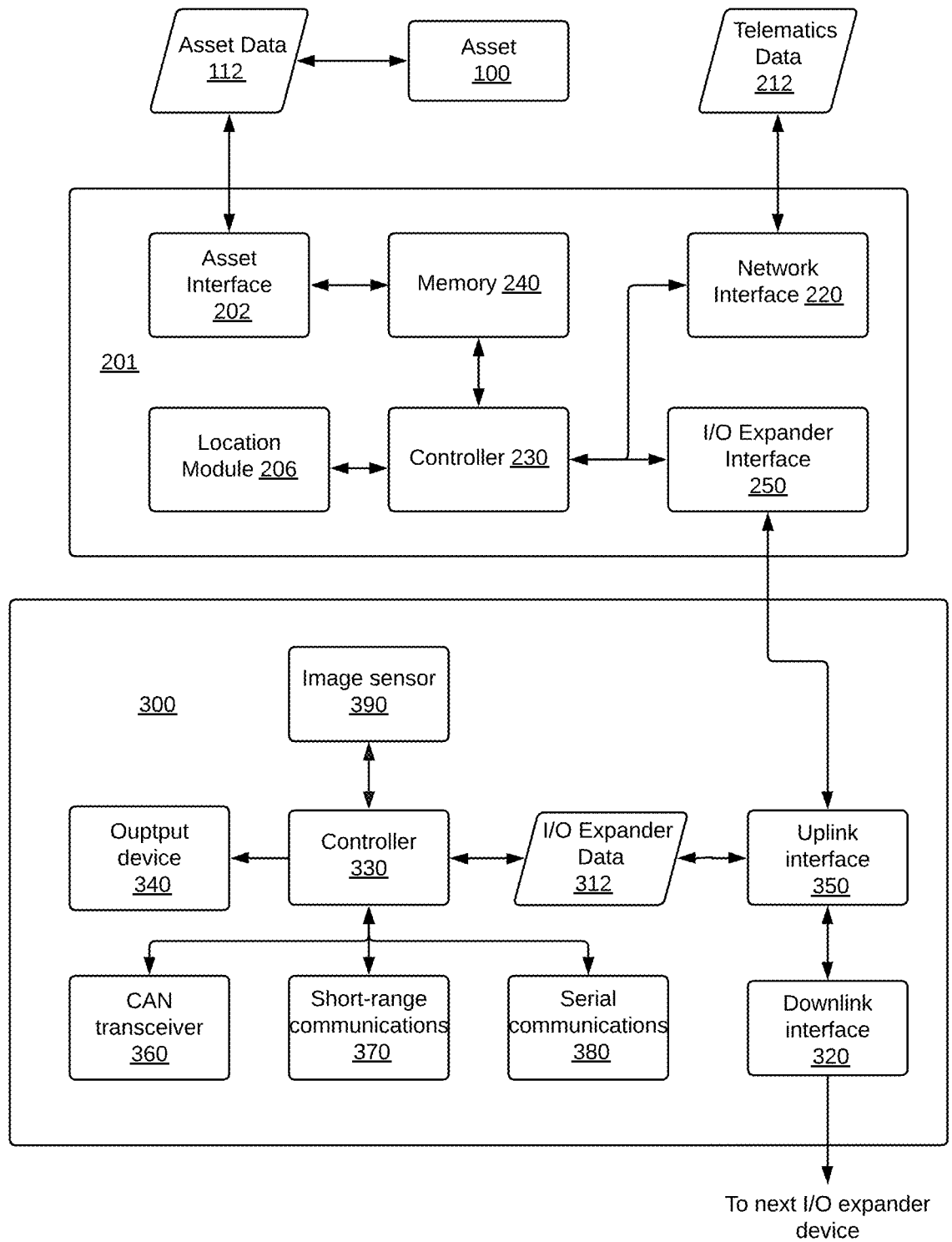
FIG. 3 is a block diagram showing a telematics device coupled to an asset and to an input/output (I/O) expander.

To capture and provide information or services not provided by the asset 100 or the telematics device, to produce an output, or to perform an action not supported by the telematics device, the telematics device 200 may be modified to allow an input/output expander device ("I/O expander") to connect thereto, as shown in FIG. 3. FIG. 3 shows a telematics device 201 coupled to an asset 100. An I/O expander 300 is coupled to the telematics device 201.

The asset 100 is similar to the asset 100 of FIG. 2 and therefore the internal components thereof are not shown in FIG. 3 for simplicity.

The telematics device 201 has a somewhat similar configuration as the telematics device 200 of FIG. 2, but some of the optional components have been removed. Furthermore, the telematics device 201 adds an I/O expander interface 250 for interfacing with the I/O expander 300. The I/O expander interface 250 is coupled to the controller 230 and may be configured for exchanging I/O expander data 312 with the I/O expander 300.

The I/O expander 300 of FIG. 3 is an example I/O expander which is designed to provide additional connectivity options to a telematics device 200, which has more limited features than the one shown in FIG. 2. For example, the telematics device 201 shown in FIG. 3 does not have an NFC module, a short-range wireless communications module, or a serial communications module. Instead, the telematics device 201 has an I/O expander interface 250.

The I/O expander 300 may be an input device configured to capture additional data such as video frames, audio frames, or proprietary signals and provide that data to the telematics device 201. Alternatively, or additionally, the I/O expander 300 may be configured as an output device and may include a display for displaying information and/or an audio output device for broadcasting messages pertaining to the asset 100.

An I/O expander 300, which connects with the telematics device 201, varies in complexity depending on the purpose thereof. FIG. 3 shows an I/O expander 300 containing several components which may or may not all be present in other I/O expanders. For example, the I/O expander 300 includes a controller 330, a CAN module 360, an output device 340, a short-range communications module 370, an image sensor 390, a serial communications module 380, an uplink interface 350 and a downlink interface 320.

The controller 330 may be similar to the controller 230 in FIG. 3. In some embodiments, the controller 330 is a microcontroller with versatile I/O capabilities. For example, the controller 330 may be a microcontroller which has a plurality of I/O ports such as general-purpose inputs and outputs (GPIOs), serial ports, analog inputs, and the like. In some embodiments, the controller 330 may have built-in persistent memory such as flash memory on which machine-executable programming instructions for conducting the functionality of the I/O expander 300 may be stored. In other embodiments, the controller 330 may be coupled to a persistent memory module (not shown) that contains the machine-executable programming instructions for conducting the functionality of the I/O expander 300. The controller 330 may also have built-in volatile memory, such as random-access memory (RAM) for storing data. Alternatively, the I/O expander 300 may be connected to an external volatile memory for storing data.

The output device 340 receives data from the controller 330 and performs an output function. For example, the output device 340 may include a display for displaying information received from the controller 330. As another example, the output device 340 may include a speech synthesizer and a speaker for displaying audible information received from the controller 330. As yet another example, the output device 340 may be an output interface to a hardware device. For example, the output device 340 may be a motor controller that interfaces to an electric motor.

The CAN module 360, short-range communications module 370, and the serial communications module 380 are similar to the NFC module 260, short-range wireless communications module 270, and the serial communications module 280 described above with reference to FIG. 2.

The image sensor 390 may be a digital still camera or a digital video camera capable of capturing images. For example, the image sensor 390 may be a road-facing dashboard camera for monitoring the road ahead. In other examples, the image sensor 390 may be a driver-facing dashboard camera for identifying the operator 10 and/or their condition.

The uplink interface 350 is an electronic peripheral interface coupled to the controller 330 and is used to provide data exchange and/or power capabilities to the I/O expander 300. The uplink interface 350 allows the I/O expander 300 to transmit and receive I/O expander data. The uplink interface 350 is configured to use the same protocol and signaling as the I/O expander interface 250 of the telematics device 201. Accordingly, the I/O expander 300 may exchange the I/O expander data with the telematics device 201. In some embodiments, the uplink interface 350 may also include power pins connected to corresponding power pins in the I/O expander interface 250, thus allowing the I/O expander 300 to be powered via the telematics device 201. In other embodiments (not shown), the I/O expander 300 may have its own power source instead of or in addition to the power provided by the telematics device 201 via the uplink interface 350.

The downlink interface 320 is an electronic peripheral interface coupled to the uplink interface 350. The downlink interface 320 is configured to interface with the uplink interface 350 of another I/O expander 300 (as will be described below). Allowing the uplink interface 350 to connect to the downlink interface 320 of another I/O expander allows connecting multiple I/O expanders.

Integrated Telematics Device

Figure 4:
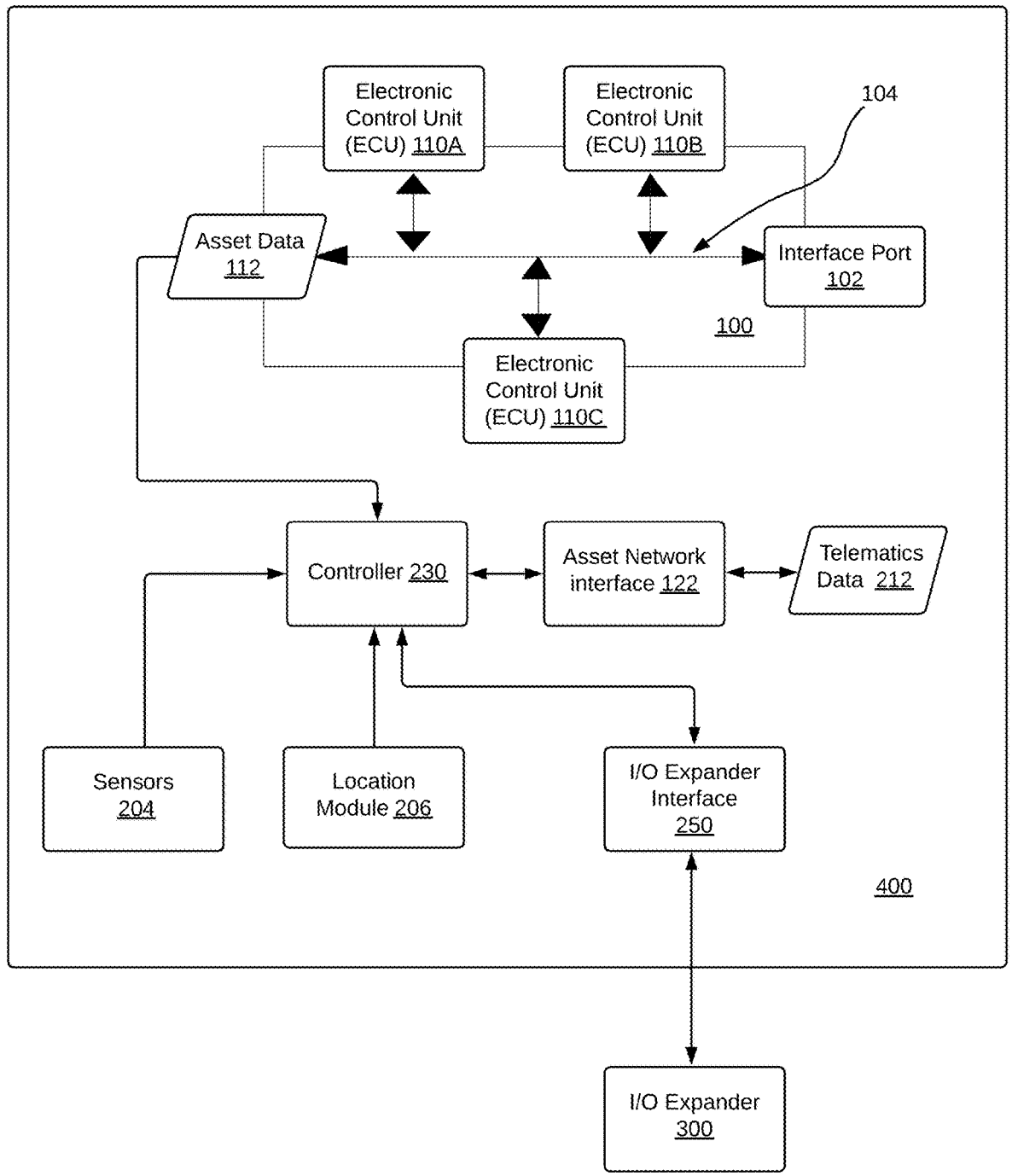
FIG. 4 is a block diagram showing an asset having a telematics device integrated therein and I/O expander coupled thereto.

In the above-mentioned figures, a telematics device is shown as a separate entity connected with a corresponding asset. The telematics device, however, may have its components integrated into the asset 100 at the time of manufacture of the asset 100. This may be the case when the asset 100 is a connected car having an asset network interface. For example, with reference to FIG. 4, there is shown an asset 400 with the components of a telematics device integrated therein, in accordance with embodiments of the present disclosure. The asset 400 is similar to the asset 100 but, being a connected asset such as a connected car, it has an asset network interface 122. In the depicted embodiment, the controller 230 is directly connected to the asset communications bus, which is a CAN bus 104 and may directly obtain the asset data 112 therefrom. The sensors 204 and the location module 206 are also integrated into the asset 100 and provide the sensor data 205 and the location data 207 to the controller 230 as described above. The asset network interface 122 belongs to the asset 400 and may be used by the asset 400 to communicate with an original equipment manufacturer (OEM) server, to a roadside assistance server, or for other purposes. The controller 230 may utilize the asset network interface 122 for the transmission of telematics data 212 provided by the controller 230. In order to support further not provided by the integrated peripherals such as the sensors 204 and the location module 206, the asset has an I/O expander interface 250 coupled to the controller 230 so that an I/O expander 300 may be connected to the asset 400 therethrough. The asset 400 may have an interface port 102 for connecting other devices other than a telematics device 200, such as a diagnostic tool including, but not limited to, an OBD-II reader device.

Capturing Asset Data

A telematics device 200 may capture asset data 112 via the interface port 102 of an asset 100 via one of two main methods. The first method is for the telematics device 200 to listen for and capture broadcast data placed by the ECUs 110 on the asset communications bus. For example, for the CAN bus 104, the ECUs 110 may place broadcast CAN frames on the CAN bus 104 that the telematics device 200 can capture over the interface port. The second method is for the telematics device 200 to explicitly request information from an ECU 110 using a request command. In response to the request command, the particular ECU provides a response containing the requested information by placing the requested information on the CAN bus 104.

OBD Port Signals

Figure 6:
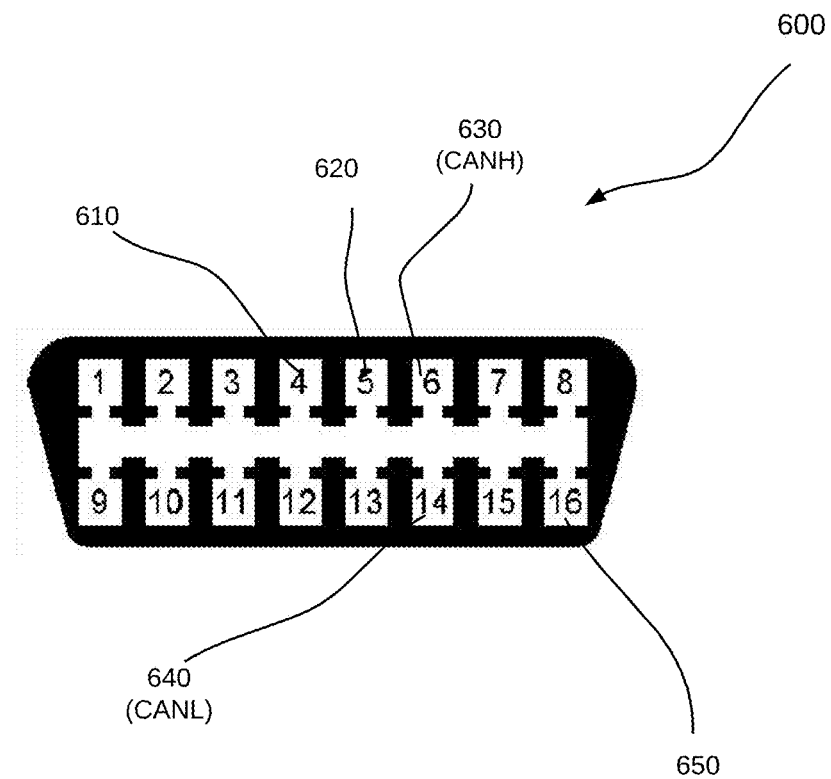
FIG. 6 is a diagram representing an OBD connector pinout.

On a CAN bus 104, data is exchanged over two signal lines named CANH (CAN High) and CANL (CAN Low). For example, a typical OBD port on a vehicle has a number of pins including a CANH pin and a CANL pin. An example of an OBD port 600 is shown in FIG. 6. The OBD port 600 has a chassis ground pin 610 (pin 4 of the connector), a signal ground pin 620 (pin 5 of the connector), a CANH pin 630 (pin 6 of the connector), a CANL pin 640 (pin 14 of the connector), and a power pin 650 (pin 16 of the connector). The CANH pin 630 and the CANL pin 640 carry CAN data that needs to be captured by a telematics device. It should be mentioned that the OBD port 600 may carry other signals but are not shown for brevity.

CAN Bus Voltage Levels

Figure 7:
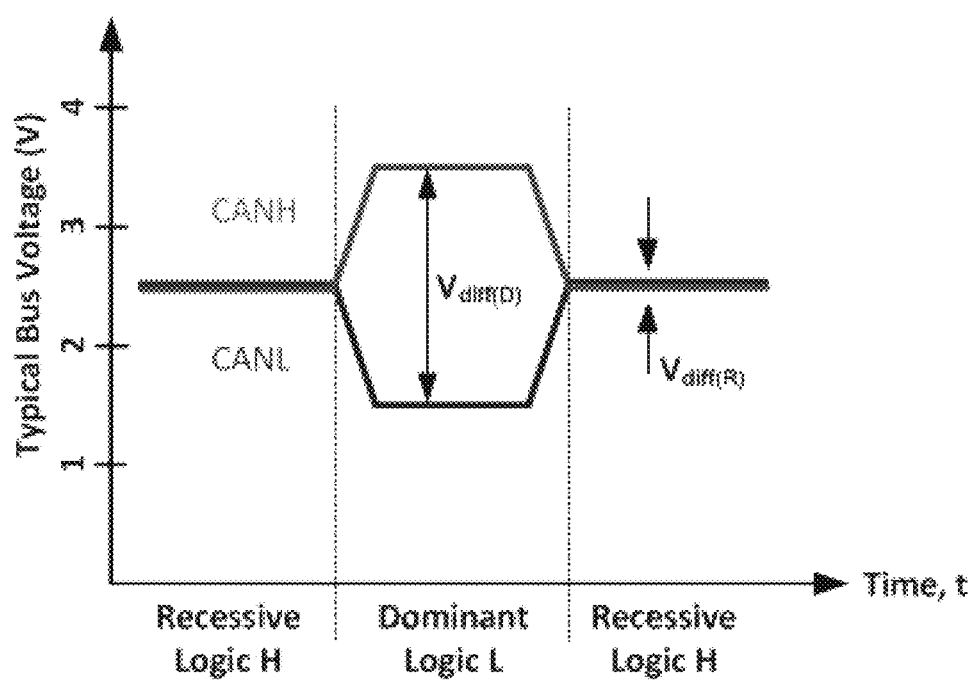
FIG. 7 is a graph showing voltage levels for Controller Area Network (CAN) buses in both the dominant and the recessive states.

Data on a CAN bus is represented by the CANH and CANL signals. As shown in FIG. 7, the CAN interface defines logic "0" ("LOW") as the dominant state, and logic "1" ("HIGH") as the recessive state. In the dominant state, the CANH signal is set to a voltage of 3.5V while the CANL signal is set to a voltage of 1.5V. In the recessive state, the CANH and the CANL are both set to 2.5V.

Inaccessibility of Asset Data

Figure 5A:
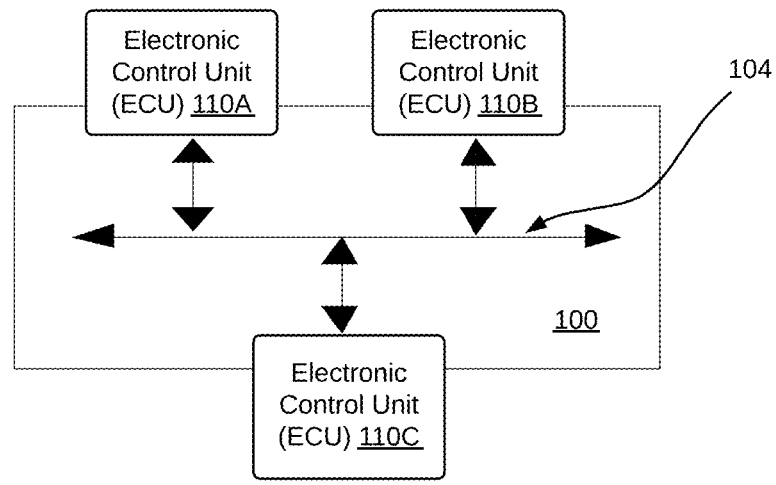
FIG. 5A is a block diagram showing an asset communications bus, which is not connected to an interface port.

While many assets have an interface port 102, such as the OBD port 600, that provides access to the asset communications bus, such as the CAN bus 104, some assets do not have an interface port 102. In such assets, the asset communications bus is for communications between the ECUs and no asset data is accessible by a telematics device. For example, FIG. 5A shows an asset communications bus in the form of a CAN bus 104 on which a plurality of ECUs 110 are connected, but has no interface port permitting access to the data exchanged on the asset communications bus, such as the CAN bus 104 by a telematics device or a diagnostic tool.

Figure 5B:
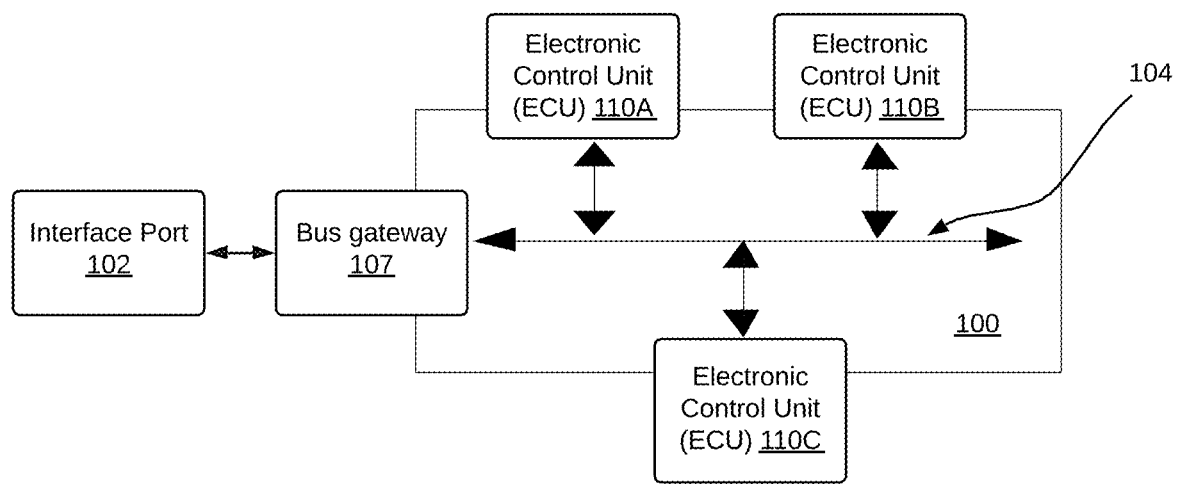
FIG. 5B is a block diagram showing an asset communications bus, connected to an interface port via a bus gateway.

Other assets may have an asset communications bus, a gateway, and an interface port. In such assets, the gateway is positioned between the asset communications bus and the interface port. The gateway has one or more rules that block certain data from passing from the asset communications bus to the interface port. With reference to FIG. 5B, the gateway 107 is an electronic device that connects the CAN bus 104 to the interface port 102. The gateway 107 is configured to pass only some data from the CAN bus 104 to the interface port 102. For example, in some implementations the gateway 107 blocks broadcast CAN traffic from passing from the CAN bus 104 to the interface port 102. Accordingly, a telematics device connected to the interface port 102 cannot capture any broadcast asset data, such as broadcast CAN data.

Coupling Harness Alternative

Figure 8:
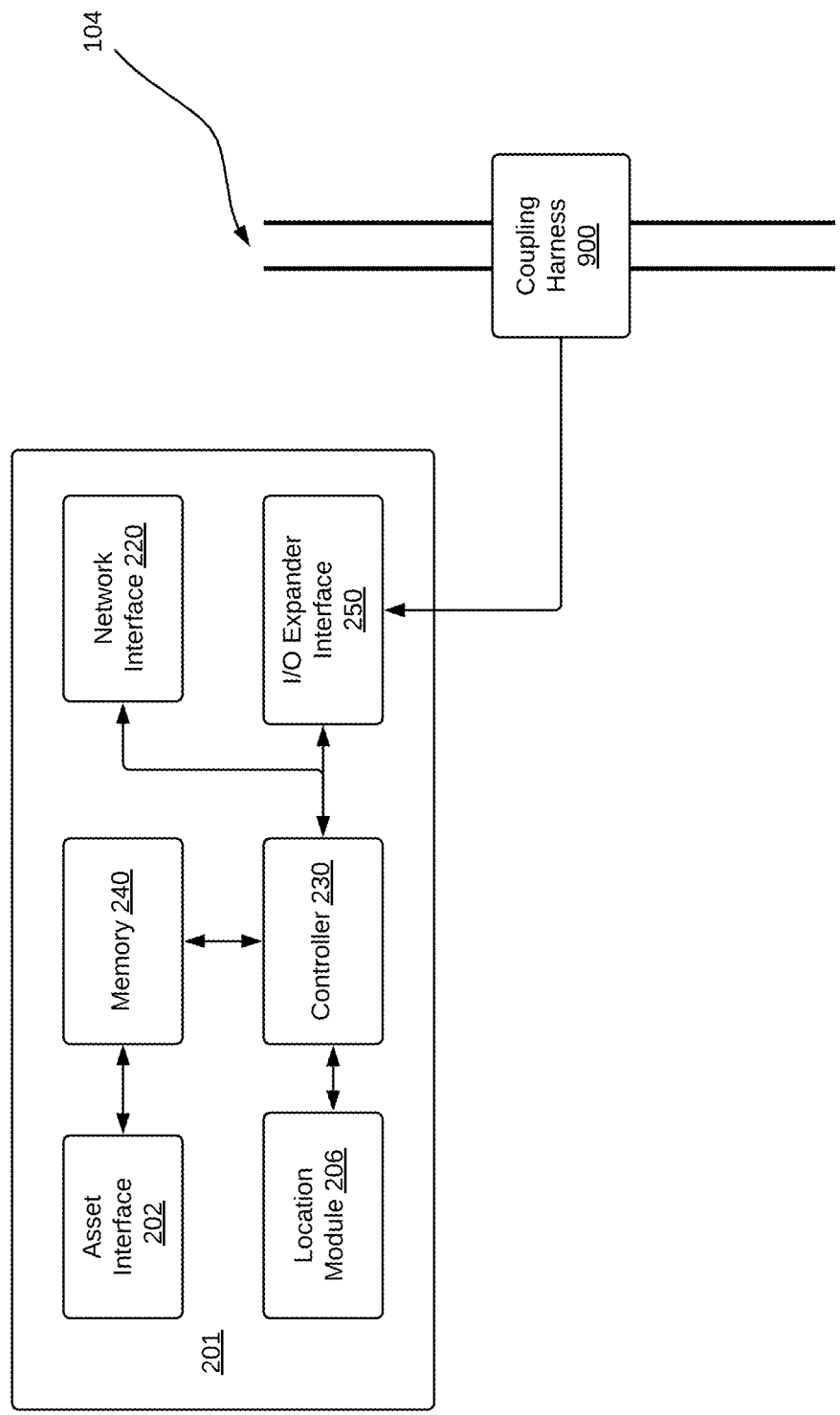
FIG. 8 is a block diagram depicting a coupling harness connected to a telematics device via an I/O expander interface.

As discussed, some vehicles either do not contain an OBD port 600 that provides access to CAN signal lines, or contain a gateway that is positioned between the CAN bus and the OBD port thus blocking most of the CAN messages so the CAN messages may not be captured by a telematics device or a diagnostic tool. One alternative that may be used to capture the CAN signals is a coupling harness. A coupling harness contains a capacitive clamp that clamps onto CAN bus signal lines (wires) corresponding to the CANH and CANL signals. When signals pass through the CAN bus signal lines, the capacitive clamp captures the signal through capacitive coupling. The captured CAN signals are coupled CAN signals which are noisy and smaller in magnitude than normal CAN signals shown in FIG. 7. A coupling harness thus contains components for conditioning the coupled CAN signals and providing regular CAN signals that can be fed to a host device, such as a telematics device or an I/O expander. For example, with reference to FIG. 8, there is shown a simplified depiction of a coupling harness 900 that captures coupled CAN signals from the CAN bus 104 and sends the coupled CAN signals to the telematics device 201 via the I/O expander interface 250. In the example of FIG. 8, the I/O expander interface 250 is a CAN transceiver. The detailed structure and operation of a coupling harness 900 is described further below.

Clamp Orientation Problem

As will be described in more details below, the CAN bus signal lines carrying the CANL and CANH signals are not always easily distinguished from one another in vehicles. Accordingly, when a coupling clamp is clamped onto two CAN bus lines which are known to correspond to the CANL signal and the CANH signal, there are two possible orientations of the coupling clamp relative to the CANL and the CANH signals. The two possible orientations mean that interpreting the coupled CAN signals needs to consider the orientation and perform logic correction. This will be described in more details below.

Coupling Harness with Orientation Detection and Logic Correction

Figure 9:
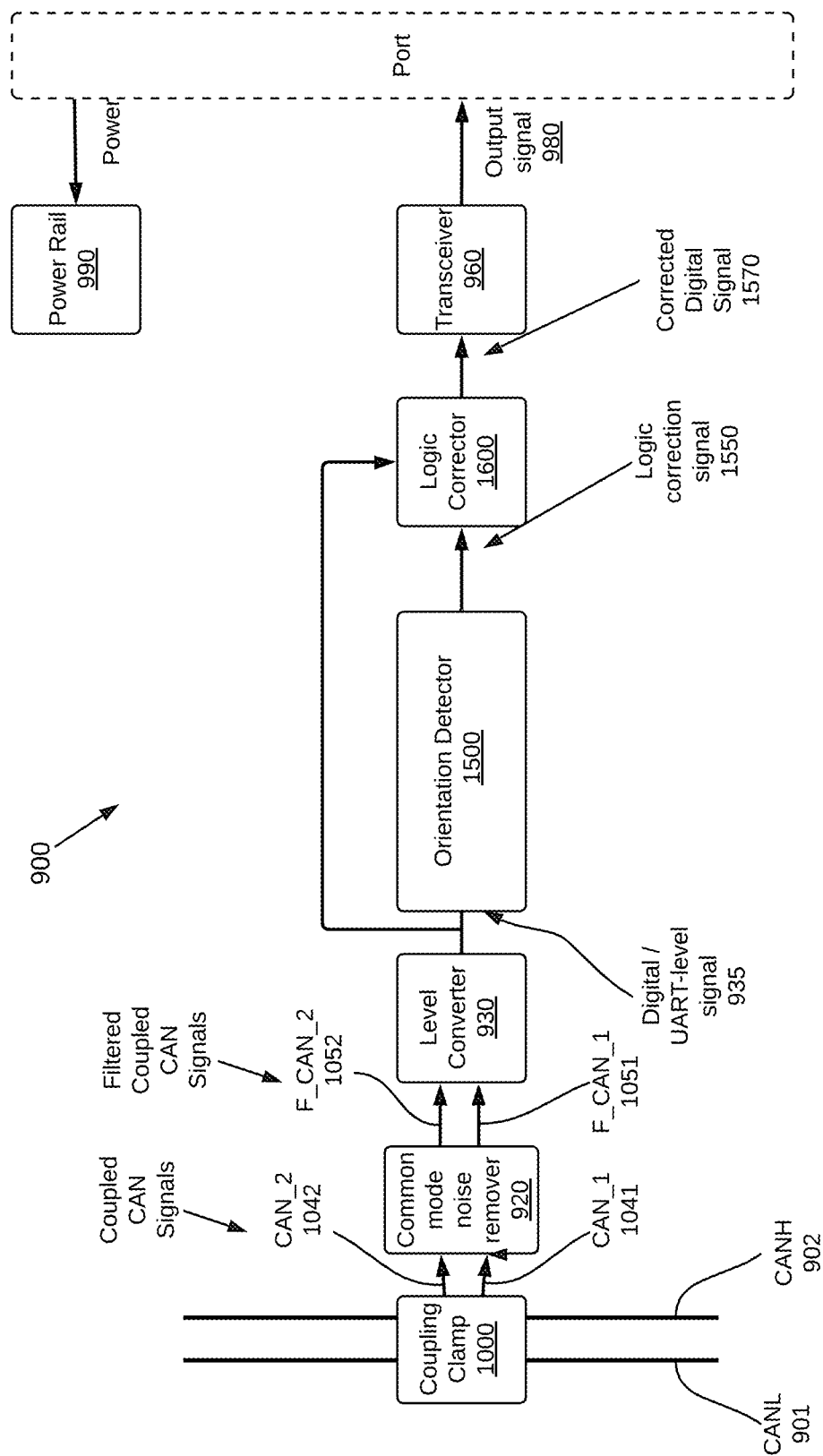
FIG. 9 is a block diagram depicting the basic components of a coupling harness, in accordance with embodiments of the present disclosure.

In one aspect of the present disclosure, there is provided a coupling harness with orientation detection and logic correction capability. For example, FIG. 9 depicts a coupling harness 900 with orientation detection and logic correction, in accordance with embodiments of the present disclosure. The coupling harness 900 comprises a coupling clamp 1000, a common mode noise remover 920, a level converter 930, an orientation detector 1500, a logic corrector 1600, a transceiver 960, and a power rail 990.

Coupling Clamp

The coupling clamp is a device that provides a coupled signal from a signal passing through a cable or a signal line passing therethrough. For example, with reference to FIG. 10A, FIG. 10B, FIG. 10C, and FIG. 10D there is shown a simplified depiction of a coupling clamp 1000. The coupling clamp 1000 is comprised of an upper housing portion 1020 and a lower housing portion 1010. In the depicted embodiment there are two longitudinal recesses in the lower housing portion; a left longitudinal recess 1015 and a right longitudinal recess 1016. The two longitudinal recesses are for the insertion of signal lines therein from which a coupled signal is to be extracted by capacitive coupling. A coupling clamp typically has at least one coupling element, which produces a coupled signal when the coupling element is in proximity of signal lines having electrical signals passing therethrough. In the depicted embodiment, the lower housing portion 1010 has a left coupling conductor 1031 disposed under the left longitudinal recess 1015, proximal thereto, and oriented substantially parallel thereto. The lower housing portion 1010 also has a right coupling conductor 1032 disposed under the right longitudinal recess 1016, proximal thereto, and oriented substantially parallel thereto. Each coupling element has a coupling signal line connected thereto. For example, the left coupling conductor 1031 has a first coupled signal line 1041 connected thereto and the right coupling conductor 1032 has a second coupled signal line 1042 connected thereto.

Figure 10A:
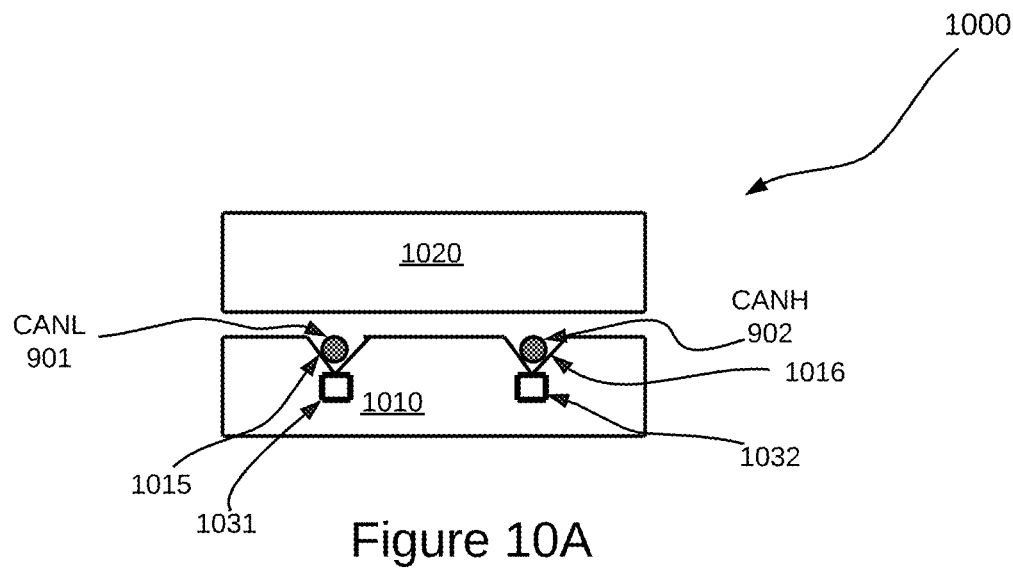
FIG. 10A is a simplified cross-sectional side view of a coupling clamp of a coupling harness clamped around two CAN cables in a first orientation relative thereto, in accordance with embodiments of the present disclosure.
Figure 10B:
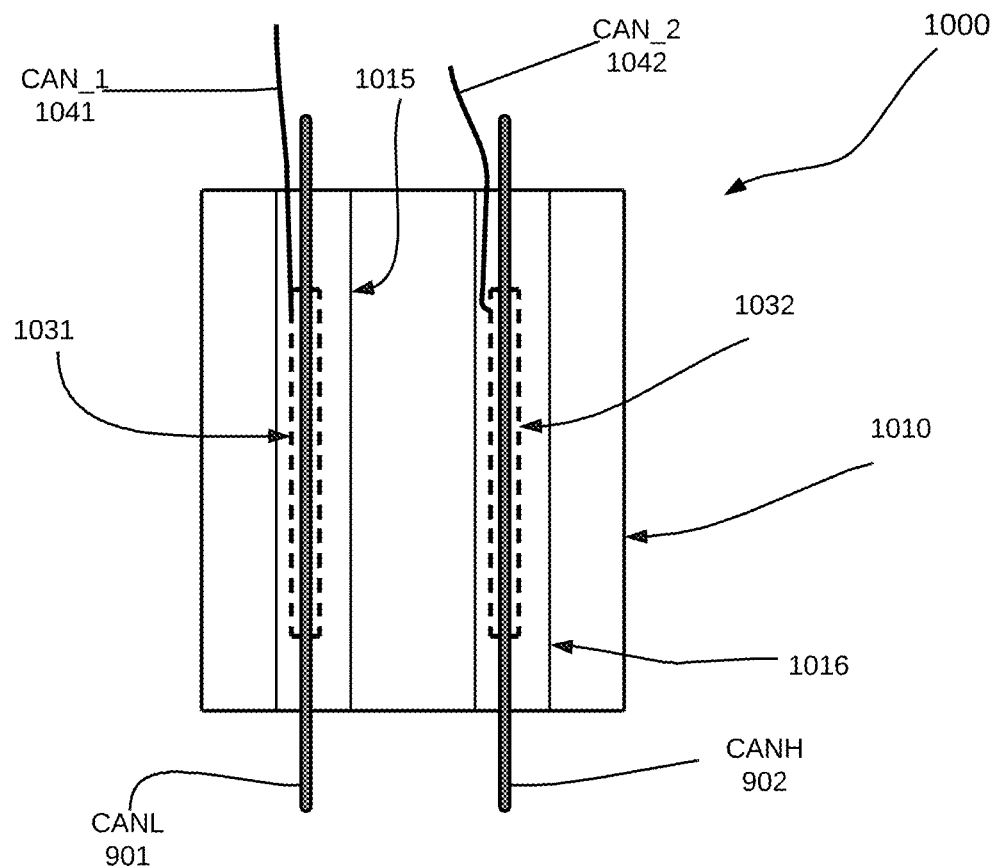
FIG. 10B is a top plan view of the bottom housing portion of the coupling clamp of FIG. 10A, in accordance with embodiments of the present disclosure.

As depicted in FIG. 10A and FIG. 10B a CANL signal line 901 is inserted in the left longitudinal recess 1015 proximal to the left coupling conductor 1031. Similarly, the CANH signal line 902 is inserted in the right longitudinal recess 1016 proximal to the right coupling conductor 1032. In the depicted arrangement when current travels through the CANL signal line 901 and the CANH signal line 902, coupled CAN signals are produced in the left coupling conductor 1031, and the right coupling conductor 1032, respectively. The coupled CAN signals are induced into the coupling conductors by capacitive coupling. When used with CAN signals, the first coupled signal line 1041 is labeled CAN_1 and the second coupled signal line 1042 is labeled CAN_2. In the depicted embodiment of FIG. 10A and FIG. 10B, the first coupled signal line 1041 labeled CAN_1 will carry a coupled CANL signal. The second coupled signal line 1042 labeled CAN_2 will carry a coupled CANH signal.

Possible Opposite Orientation

It should be noted that the coupling clamp 1000 may be oriented in an opposite orientation relative to the CANL signal line 901 and the CANH signal line 902. In the opposite orientation, shown in FIG. 10C and FIG. 10D, the CANL signal line 901 is received in the right longitudinal recess 1016. Accordingly the CANL signal line 901 is proximal to the right coupling conductor 1032, which is disposed under the right longitudinal recess 1016. The CANH signal line 902 is received in the left longitudinal recess 1015 and is thus proximal to the left coupling conductor 1031, which is disposed under the left longitudinal recess 1015. In this arrangement, the first coupled signal line 1041 labeled CAN_1 carries a coupled CANH signal while the second coupled signal line 1042 labeled CAN_2 carries a coupled CANL signal.

In view of the above, it is not known at the output of the coupling clamp 1000, what signals the coupled signal lines are carrying. Specifically, it is not known which signal line is carrying a coupled CANL signal and which signal line is carrying a coupled CANH signal. As such, the coupled CAN signals cannot be reliably used unless the clamp orientation is determined. Determining the orientation entails converting the coupled CAN signals to digital or UART-level signals. In this disclosure, a "digital" signal and a "UART-level" are used interchangeably and refer to a signal wherein a logic HIGH is represented by a positive voltage and a logic LOW is represented by zero voltage. When a CAN signal is correctly converted to a digital signal, a recessive state on the CAN bus which represents a logic HIGH signal is represented by a positive voltage in the digital signal. Conversely, a dominant state on the CAN bus which represents a logic LOW signal is represented by zero voltage in the digital signal. Prior to converting the coupled CAN signals to digital values, the coupled CAN signals may need to be filtered of some noise.

Common Noise Removal

The coupled CAN signals running in the first coupled signal line 1041 and the second coupled signal line 1042 may be noisy signals. Specifically, the signals may have high frequency noise common to both signals. The common noise may pose problems for later stages of the coupling harness and/or cause interference problems therein. It is thus desirable to remove the common mode noise from the coupled CAN signals in the CAN_1 signal line and the CAN_2 signal line. A common mode noise remover 920 removes the common mode noise from the two coupled CAN signals running in the first coupled signal line 1041 (CAN_1) and the second coupled signal line 1042 (CAN_2). In some implementations the common mode noise remover 920 is a common mode choke which is an electrical filter that blocks high frequency noise common to two or more data or power lines while allowing the DC or low-frequency signal to pass. In a common mode choke current flows in the same direction in two coils that are mutually coupled. The respective magnetic fields from the two coils are opposed to one another thus blocking the common mode noise. The outputs of the common mode noise remover 920 are a first filtered coupled CAN signal on the first filtered coupled signal line 1051 and a second filtered coupled CAN signal on the second filtered coupled signal line 1052.

Orientation Detection

Figure 10C:
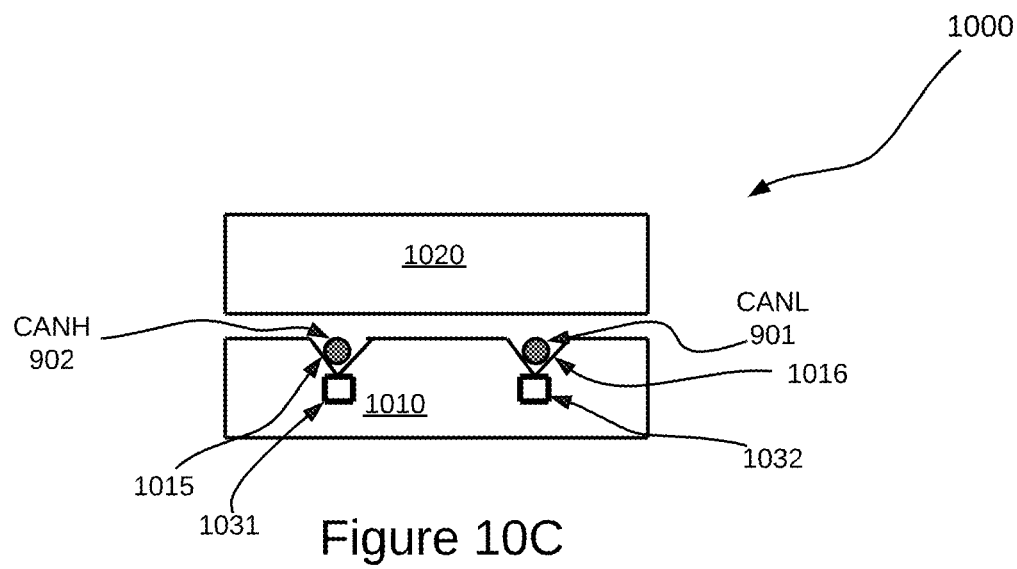
FIG. 10C is a simplified cross-sectional side view of the coupling clamp of FIG. 10A wherein the coupling harness is clamped around the two CAN cables in a second orientation relative thereto.
Figure 10D:
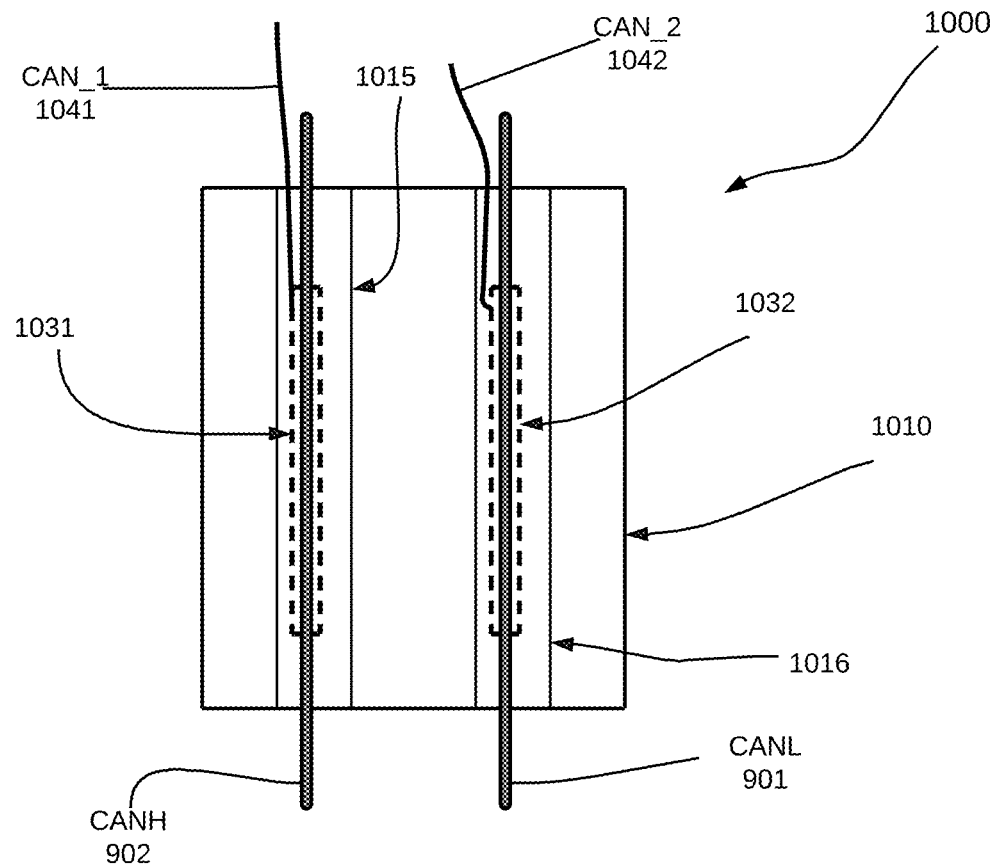
FIG. 10D is a top plan view of the bottom housing portion of the coupling clamp of FIG. 10C, in accordance with embodiments of the present disclosure.

As discussed above, there are two possible orientations for the coupling clamp 1000 in relation to the CAN signal lines namely the CANL signal line 901 and the CANH signal line 902. In order to capture usable data from the filtered coupled CAN signals, the orientation of the clamp needs to be determined. In one orientation, the filtered coupled signals represent CAN signal levels that, when converted to digital signals, represent the correct logic of the CAN data. In the opposite orientation, the filtered coupled signals represent CAN signal levels that, when converted to digital signals, represent data that needs the logic thereof to be inverted in order to be a correct representation of the CAN data. With reference to the figures, the coupling clamp of FIG. 10A and FIG. 10B is an orientation that requires the logic of the digital signal corresponding to the coupled CAN signal to be inverted. Conversely, the coupling clamp of FIG. 10C and FIG. 10D is in an orientation that yields a digital signal corresponding to the coupled CAN signal and of the correct logic. This will be explained further below with reference to the level converter 930.

The inventors have realized that the orientation of the clamp can be determined by utilizing a particular feature of the CAN bus. The particular feature is that for a largely unsaturated CAN bus, i.e., a CAN bus with low occupancy, there are more recessive states than dominant states. This is largely because when the CAN bus is idle with no CAN data being placed thereon, the CAN bus is held in a recessive state. As discussed above, the recessive state represents a logic HIGH. In other words, most of the time, an unsaturated CAN bus is at logic HIGH.

The inventors have designed a system and method that determine whether the coupled CAN signals correspond to a first orientation that yields a digital signal having an inverse logic of the coupled CAN signals or correspond to a second orientation that yields a digital signal having the correct logic of the coupled CAN signals. The system and method utilize the above-identified feature of the CAN bus being at logic HIGH most of the time. To determine whether the digital signal corresponding to the coupled CAN signal indicates that the CAN bus has been at logic HIGH most of the time, the DC level of the digital (UART-level) signal corresponding to the coupled CAN signal is obtained. Since the CAN bus is in the recessive state (logic HIGH) most of the time, the DC level of the UART-level signal corresponding to the coupled CAN signal is going to be relatively high if the clamp is in a second orientation that yields a digital signal of the correct logic. Conversely, the DC level of the digital signal will be relatively low if the clamp is in a first orientation that yields a digital signal of the incorrect logic. In other words, if the coupling clamp 1000 is in the correct orientation, the DC level of the digital signal will be higher than a threshold level, and if the coupling clamp 1000 is in the incorrect orientation (requiring logic inversion), the DC level of the digital signal will be lower than the threshold level.

In the above discussion, one orientation of the CAN clamp is described as producing a digital signal of the correct logic and is hence termed the "correct orientation". The opposite orientation of the CAN clamp is termed the "incorrect orientation". This terminology merely refers to the fact that a digital signal generated from the coupled CAN signal in the first orientation needs to be logically inverted, i.e., passed through a digital inverter. There is nothing inherently incorrect with the first orientation nor is there a correct way and an incorrect way to couple a coupling clamp 1000 to CAN bus signal lines. However, a coupling harness that works only in one orientation will provide incorrect data if the coupling clamp 1000 is coupled to the CAN bus signal lines in the opposite orientation.

The orientation detection mechanism described herein relies on the DC level of the digital signal equivalent to the coupled CAN signals. As such, it is necessary to convert the coupled CAN signals to digital (or UART-level) signals. For example, in a digital signal, a logic HIGH has a voltage of something like 5V or 3.3V, while a logic LOW is 0V. The coupled signals also need to be converted to a digital signal that is eventually input into a transceiver, such as the transceiver 960.

Level Converter

As discussed above, the coupled CAN signal needs to be converted to a UART-level (digital) signal. The level converter 930 converts the coupled CAN signal to a UART-level signal. One possible implementation of the level converter 930 uses an inverting analog comparator with a positive feedback, as shown in FIG. 11.

Figure 11:
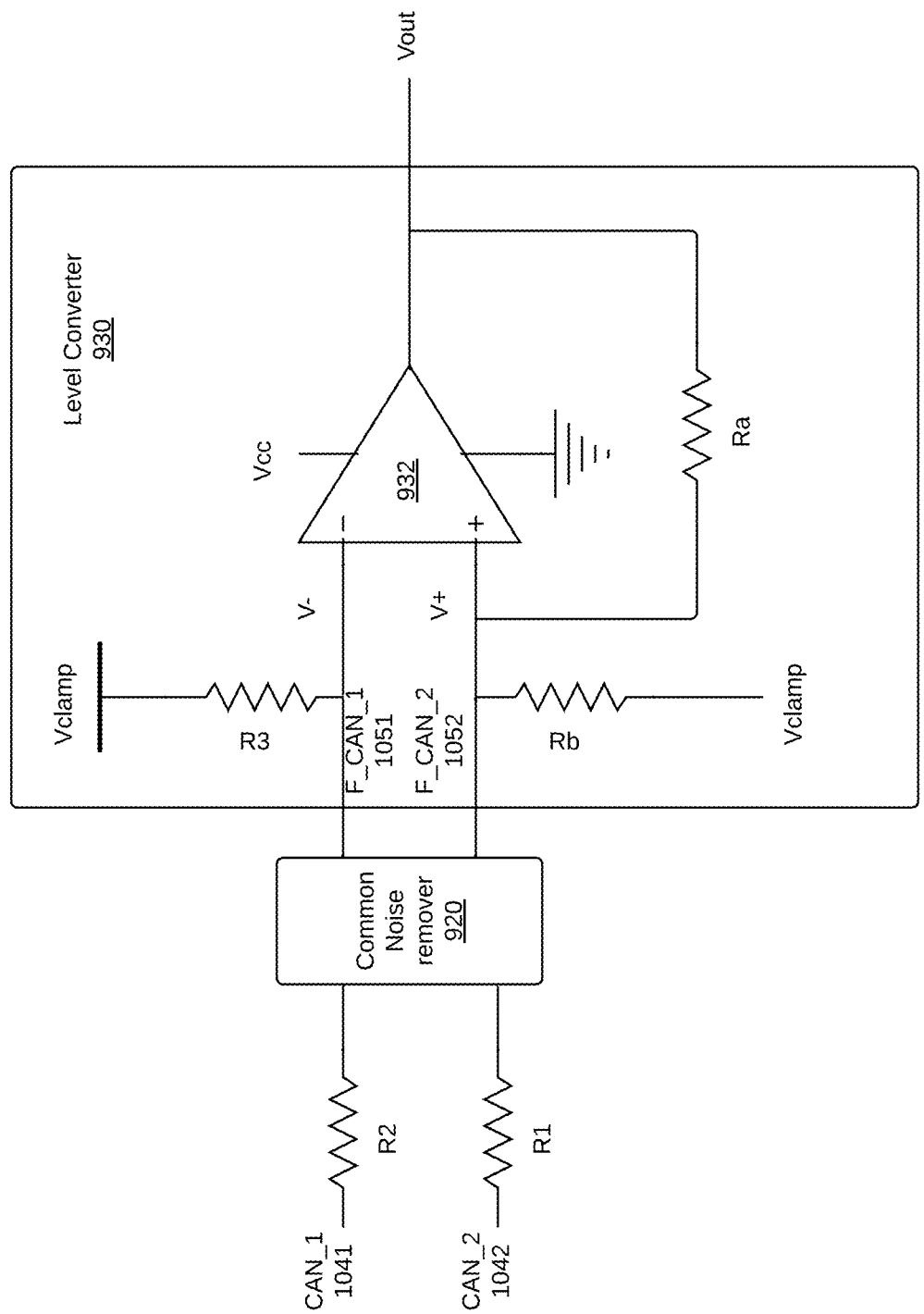
FIG. 11 is a simplified circuit diagram depicting an exemplary implementation of a level converter, in accordance with embodiments of the present disclosure.

FIG. 11 shows the coupled CAN signals on the first coupled signal line 1041 and the second coupled signal line 1042 being fed into the common mode noise remover 920 via the resistors R1 and R2. The outputs of common mode noise remover 920 are a first filtered coupled CAN signal F_CAN_1 on the first filtered coupled signal line 1051, and a second filtered coupled CAN signal F_CAN_2 on the second filtered coupled signal line 1052.

The filtered coupled CAN signals F_CAN_1 and F_CAN_2 typically have low voltage amplitudes. For example, the coupled CAN signals CAN_1 and CAN_2 may have amplitudes in the hundreds of millivolts. Such voltages are too low for the op amp 932 to process. As such the signals connected to the op amp inputs are biased to higher voltage by the biasing voltage Vclamp through the resistors R3 and Rb. Specifically, the first filtered coupled CAN signal F_CAN_1 is biased by the voltage Vclamp through the resistor R3, and the second filtered coupled CAN signal F_CAN_2 is biased by the voltage Vclamp through the resistor Rb.

An inverting analog comparator comprises an operational amplifier ("op amp") and a feedback resistor from the output of the op amp to the non-inverting input ("V+"). The op amp compares the inverting input V− and the non-inverting input V+. If the inverting input V− is greater than the non-inverting input V+, the output of the analog comparator is LOW. Conversely, if the non-inverting input V+ is greater than the inverting input V−, the output of the analog comparator is HIGH. The feedback resistor provides some voltage bias to V+ when the output of the analog comparator is HIGH. This voltage bias causes the op amp to trip the output thereof from HIGH to LOW and from LOW to HIGH at different values of V− causing what is known as hysteresis. The hysteresis depends on the voltage bias provided from the output voltage (Vout) to the non-inverting input V+ when the output voltage is high. The voltage bias depends on the value of the feedback resistor which connects the output voltage Vout to the non-inverting input V+, as well as the values of the resistors R1 and Rb. Specifically, the voltage bias is determined as:

$$Vout*[(Rb//R1)/((Rb//R1)+Ra)].$$

In the above formula, Rb//R1 is the equivalent parallel resistance of the resistors R1 and Rb, or:

$$R1Rb/R1+Rb$$

The voltage bias depends on the ratio between the feedback resistor (Ra) and the equivalent resistance of Rb//R1. As can be seen, if Ra has a large value, the voltage bias contributed by Vout at the non-inverting input V+ is minimal, and accordingly the hysteresis is small. For the shown embodiment, the values R1, Rb, and Ra have been chosen such that the voltage bias is in the order of a few millivolts.

In the implementation of FIG. 11, the inverting input (V−) to the op amp 932 is the first filtered coupled CAN signal F_CAN_1 which is biased by Vclamp as mentioned above. The non-inverting input (V+) to the op amp 932 is the second filtered coupled CAN signal F_CAN_2, which is biased by both Vclamp and the output voltage Vout (via the feedback resistor Ra). In the depicted embodiment the feedback resistor has a large value (e.g., 1M) and as such the bias provided to V+ therethrough is small (i.e., of the order of a few millivolts). Accordingly, the hysteresis of the analog comparator is just large enough to prevent the op amp from tripping over minor variations in the filtered coupled CAN signals but otherwise it is a small hysteresis compared to the amplitudes of the filtered coupled CAN signals F_CAN_1 and F_CAN_2 especially as biased by Vclamp.

Figure 12:
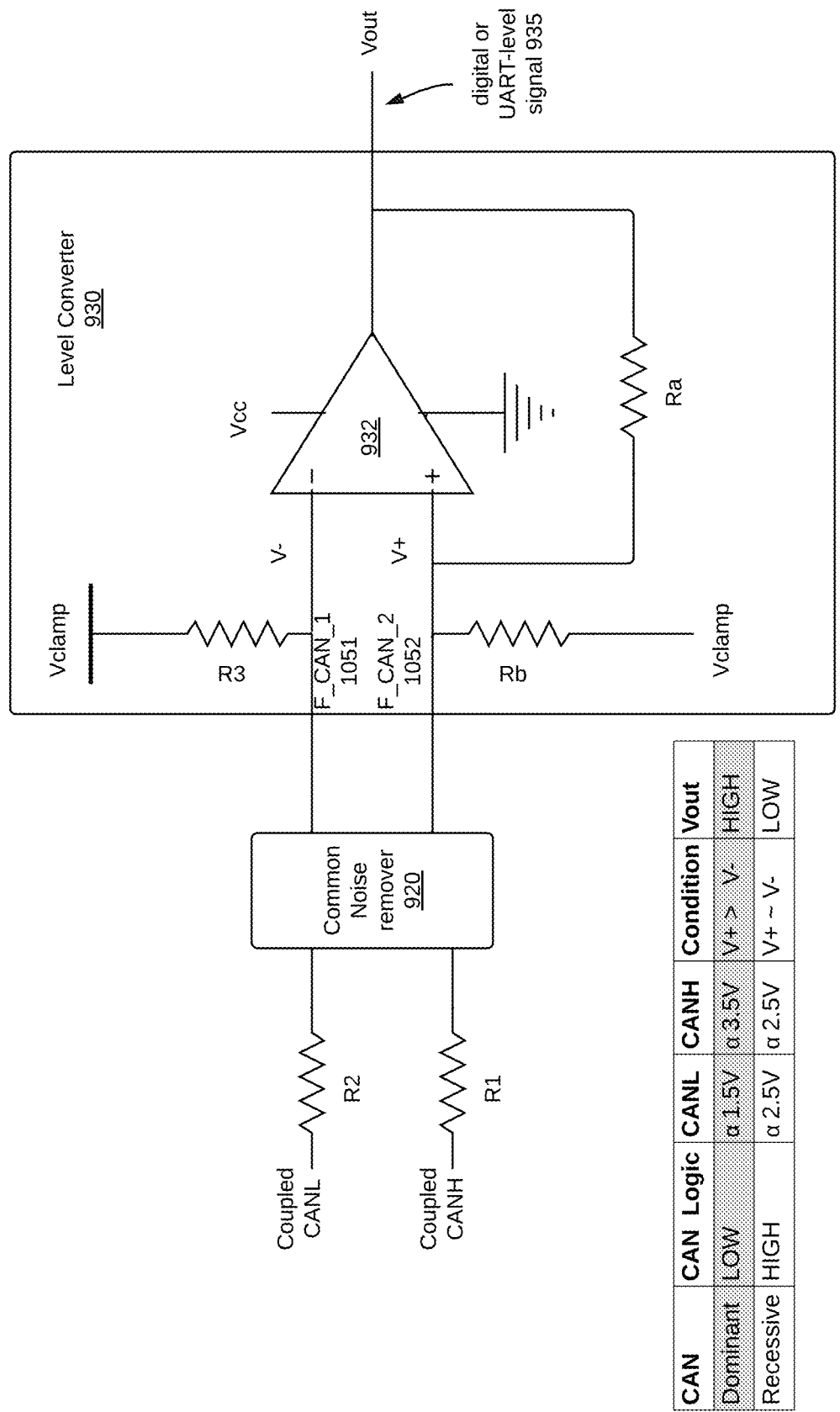
FIG. 12 depicts the circuit diagram of FIG. 11 with the CAN Low (CANL) signal applied to the inverting input and the CAN High (CANH) signal applied to the non-inverting input.

As discussed above, there are two possible orientations of the coupling clamp 1000 in relation to the CAN bus signals. As a consequence, the first filtered coupled signal line 1051 and the second filtered coupled signal line 1052 may each carry one of the filtered coupled CAN signals F_CAN_1 and F_CAN_2. FIG. 12 depicts the level converter 930 of FIG. 11 wherein the first filtered coupled CAN signal F_CAN_1 is a coupled CANL signal and the filtered coupled CAN signal F_CAN_2 is a coupled CANH signal. In other words, a coupled CANL signal is applied to the inverting input V− and the coupled CANH signal is applied to the non-inverting input V+. This is the case corresponding to the CAN signal lines being retained in the coupling clamp 1000 as shown in FIG. 10A and FIG. 10B.

As an example, it is assumed that each of the coupled CAN signals has an amplitude which is proportional to ($\alpha$) the amplitude of the original CAN signals flowing in the CANL signal line 901 and the CANH signal line 902. Accordingly, in a dominant state the coupled CANL signal is $\alpha$ 1.5V while the coupled CANH signal is $\alpha$ 3.5V. In the recessive state, both the coupled CANL and the coupled CANH signals are at $\alpha$ 2.5V. The table in FIG. 12 shows the output values of the level converter 930 corresponding to each CAN state. The dominant CAN state corresponds to logic LOW (see FIG. 7). Accordingly, the coupled CANL signal is α 1.5V and the coupled CANH signal is α 3.5V. The resistors R1 and R2, and the resistors R3 and Rb have similar values. All things considered, the voltage V− depends on CANL and the voltage V+ depends on CANH. Therefore as shown in the first row of the table in FIG. 12, V+ is greater than V− and the output Vout of the op amp 932 is HIGH. When Vout is HIGH, Vout equals the supply voltage Vcc. The supply voltage Vcc may be 2.4V, 3.3V, 5V or any other suitable UART-level or digital voltage.

The recessive CAN state corresponds to logic HIGH (see FIG. 7). In a recessive state both CANL and CANH are at substantially equal voltage. For example, in the table in FIG. 12, both CANL and CANH are at α 2.5V. In this case V+ is substantially equal to V− since, as discussed above, Ra is so high that Vout only contributes by a few millivolts to V+. As V− is substantially equal to V+, the op amp output Vout transitions from HIGH to LOW.

By observing the table in FIG. 12, it can be seen that the logic of the UART-level signal provided by Vout is the inverse of CAN logic. As a result, the logic of the level converter output needs to be corrected by being inverted.

Figure 13:
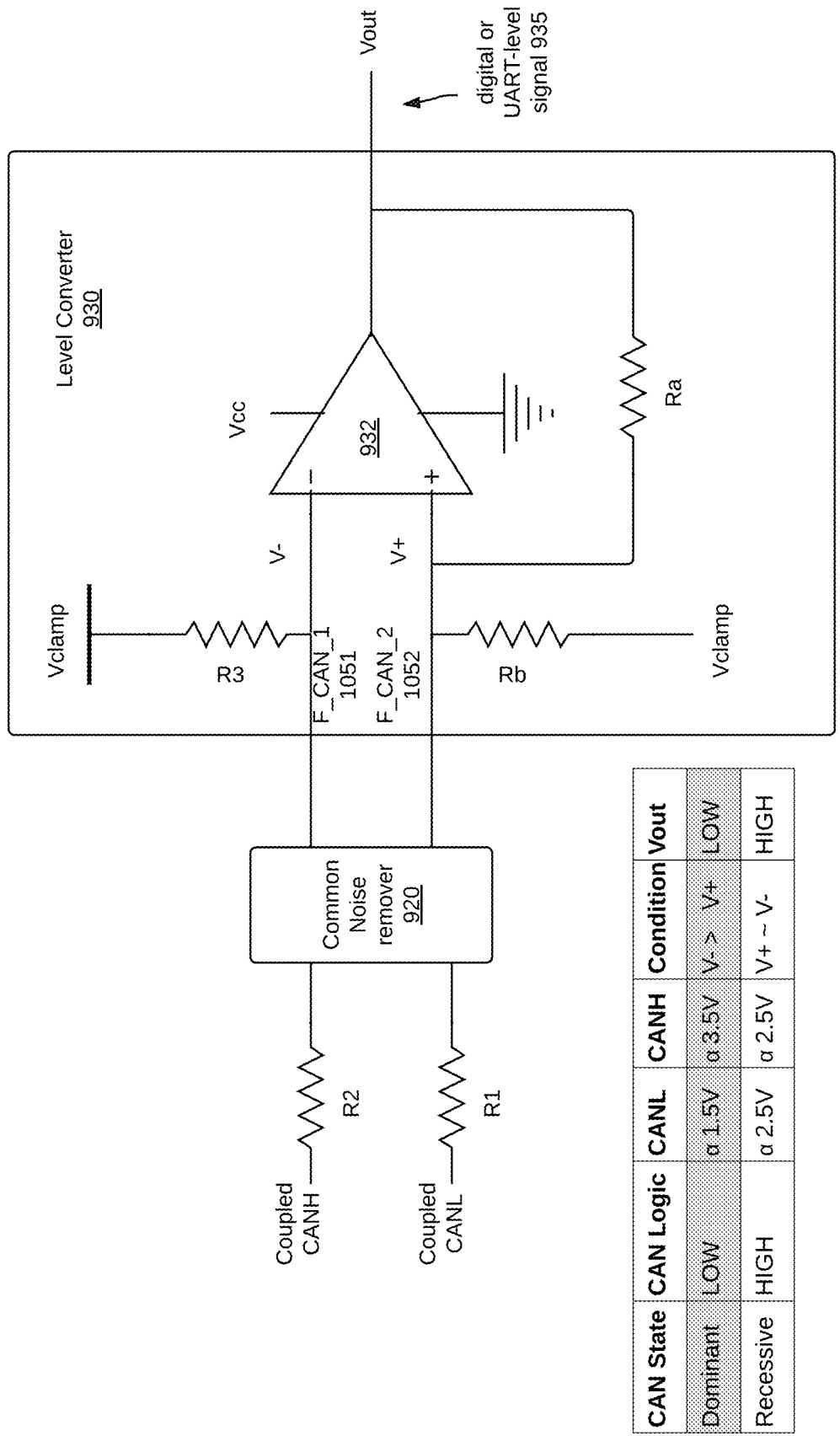
FIG. 13 depicts the circuit diagram of FIG. 11 with the CANH signal applied to the inverting input and the CANL applied to the non-inverting input.

FIG. 13 depicts the level converter 930 of FIG. 11 wherein the first filtered coupled CAN signal F_CAN_1 is a coupled CANH signal and the second filtered coupled CAN signal F_CAN_2 is a filtered coupled CANL signal. Accordingly, a coupled CANH signal is applied to the inverting input V− and the coupled CANL signal is applied to the non-inverting input V+. Using the same exemplary coupled CAN voltage levels described above, the table in FIG. 13 shows the output values of the level converter 930 corresponding to each CAN state. The dominant CAN state corresponds to logic LOW. Accordingly, the coupled CANL signal is α 1.5V and the coupled CANH signal is α 3.5V. The resistors R1 and R2, and the resistors R3 and Rb have similar values. All things considered, the voltage V− depends on CANH and the voltage V+ depends on CANL. Therefore as shown in the first row of the table in FIG. 13, V− is greater than V+ and the output Vout of the op amp 932 is LOW (i.e., 0V). When Vout is HIGH, Vout equals the supply voltage Vcc.

The recessive CAN state corresponds to logic HIGH. In a recessive state both CANL and CANH are at substantially equal voltage. For example, in the table in FIG. 13, both CANL and CANH are at α 2.5V. In this case V+ is substantially equal to V− since Vout is 0V (hence there is no feedback voltage added to V+). As V− is substantially equal to V+, the op amp output Vout transitions from LOW to HIGH. In this case, the output voltage of the op amp has the same logic as the CAN signal logic as shown in the table in FIG. 13.

Observing the tables in FIG. 12 and FIG. 13, it can be seen that the output Vout needs to have its logic inverted if the coupling clamp is coupled with the CAN bus such that CANL is applied to V− and CANH is applied to V+. Conversely, the output Vout does not need to have its logic inverted if the coupling clamp is coupled with the CAN bus such that CANH is applied to V− and CANL is applied to V+. As such, it is necessary to determine the orientation of the coupling clamp 1000 relative to the CAN bus signal lines in order to determine whether to invert the logic of the level converter output Vout.

Orientation Detection

The orientation detector 1500 operates based on the premise that the idle state of a CAN bus, or in other words, the time between consecutive CAN messages, is recessive, which is logic HIGH. As such, the average or DC value of the UART-level (digital) signal output by the level converter 930 is expected to be higher than an average voltage threshold since most of the time the signal will be at logic HIGH. If, however, the coupling clamp 1000 is inserted in an opposite orientation, the average or DC value of the UART-level signal output by the level converter 930 is expected to be lower than the average voltage threshold. To illustrate, reference is made to FIG. 14A and FIG. 14B.

Figure 14A:
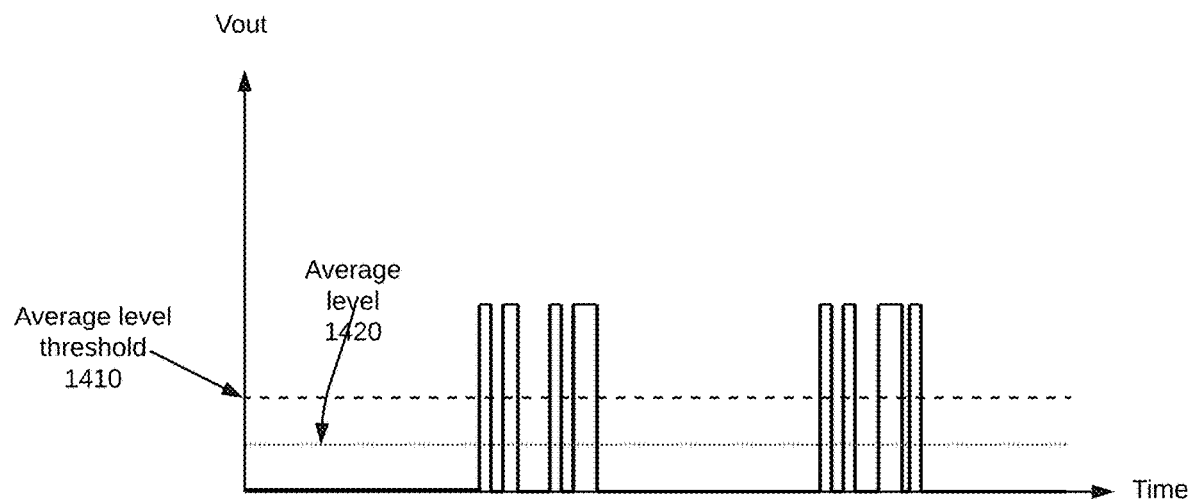
FIG. 14A is a graph depicting the voltage levels of the output of the level converter, when the coupling clamp is coupled to CAN signal lines in a first orientation.

FIG. 14A is a graph showing the voltage level of the digital signal that is output by the level converter 930, i.e. the output voltage Vout, corresponding to the arrangement of FIG. 12. As shown in the table of FIG. 12, the output Vout is LOW when the CAN bus logic is HIGH. As can be seen in FIG. 14A, the output voltage Vout is at logic LOW most of the time and the average output level thereof is lower than an average level threshold. For example, the average level threshold may be Vcc/2. The average of a signal as shown in FIG. 14A is less than Vcc/2 as the signal is at logic LOW more than 50% of the time.

Figure 14B:
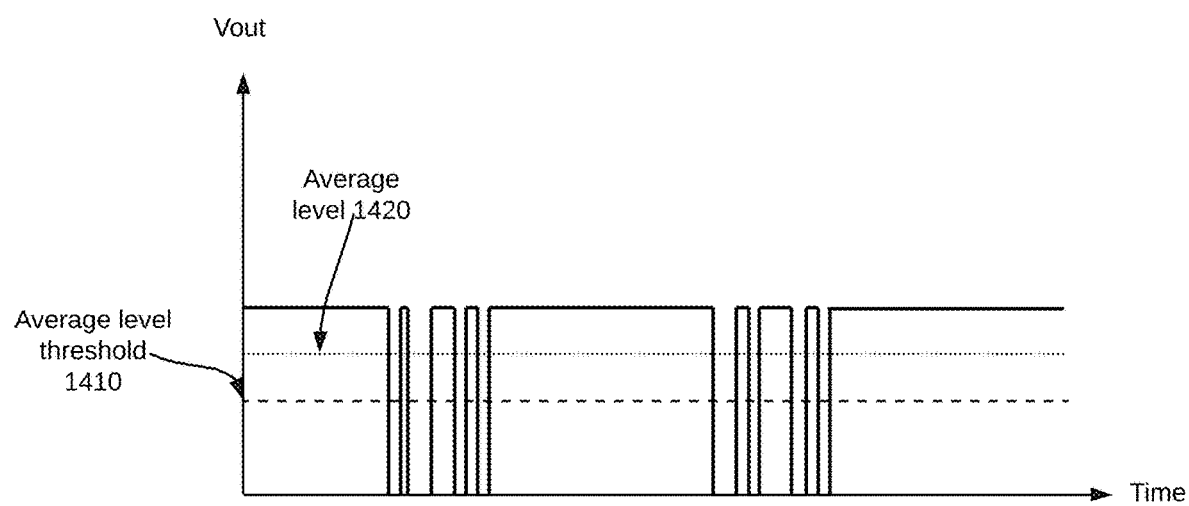
FIG. 14B is a graph depicting the voltage levels of the output of the level converter, when the coupling clamp is coupled to CAN signal lines in a second orientation.

FIG. 14B is a graph showing the voltage level of the output voltage Vout, corresponding to the arrangement of FIG. 13. As shown in the table of FIG. 13, the output Vout is HIGH when the CAN bus logic is HIGH. Since the CAN bus is HIGH most of the time (being in a recessive state between frames), the output Vout is HIGH most of the time. As a result, the average voltage corresponding to the digital signal on Vout is higher than an average level threshold. For example, the average level threshold may be Vcc/2. The average or DC level of Vout as shown in FIG. 14B is greater than Vcc/2 as the signal is at logic HIGH more than 50% of the time.

The aforementioned characteristic of the UART-level signal that is output by the level converter 930 can determine whether the logic of the signal Vout needs to be inverted or not. If the average or DC value of Vout is less than an average level threshold as shown in FIG. 14A, then as shown in the table of FIG. 12, the logic of the output Vout needs to be inverted. Conversely, if the average (DC) value of Vout is greater than the average level threshold as shown in FIG. 14B, then as shown in the table of FIG. 13, the logic of Vout does not need to be inverted.

An orientation detection circuit thus obtains the average or DC value of the UART level signal output by the level converter and then compares the average level with an average level threshold. The orientation detection circuit may use a low pass filter such as an R-C filter, an L-C filter, or an active filter to obtain the average or DC value of the output signal of the level converter. For example, an RC filter may be used to average the UART-level signal and obtain a DC value thereof. To prevent current loading, the UART-level signal may be passed through a buffer having a high input impedance. In some embodiments, the orientation detection circuit uses an op amp with a feedback to the inverting input.

Figure 15A:
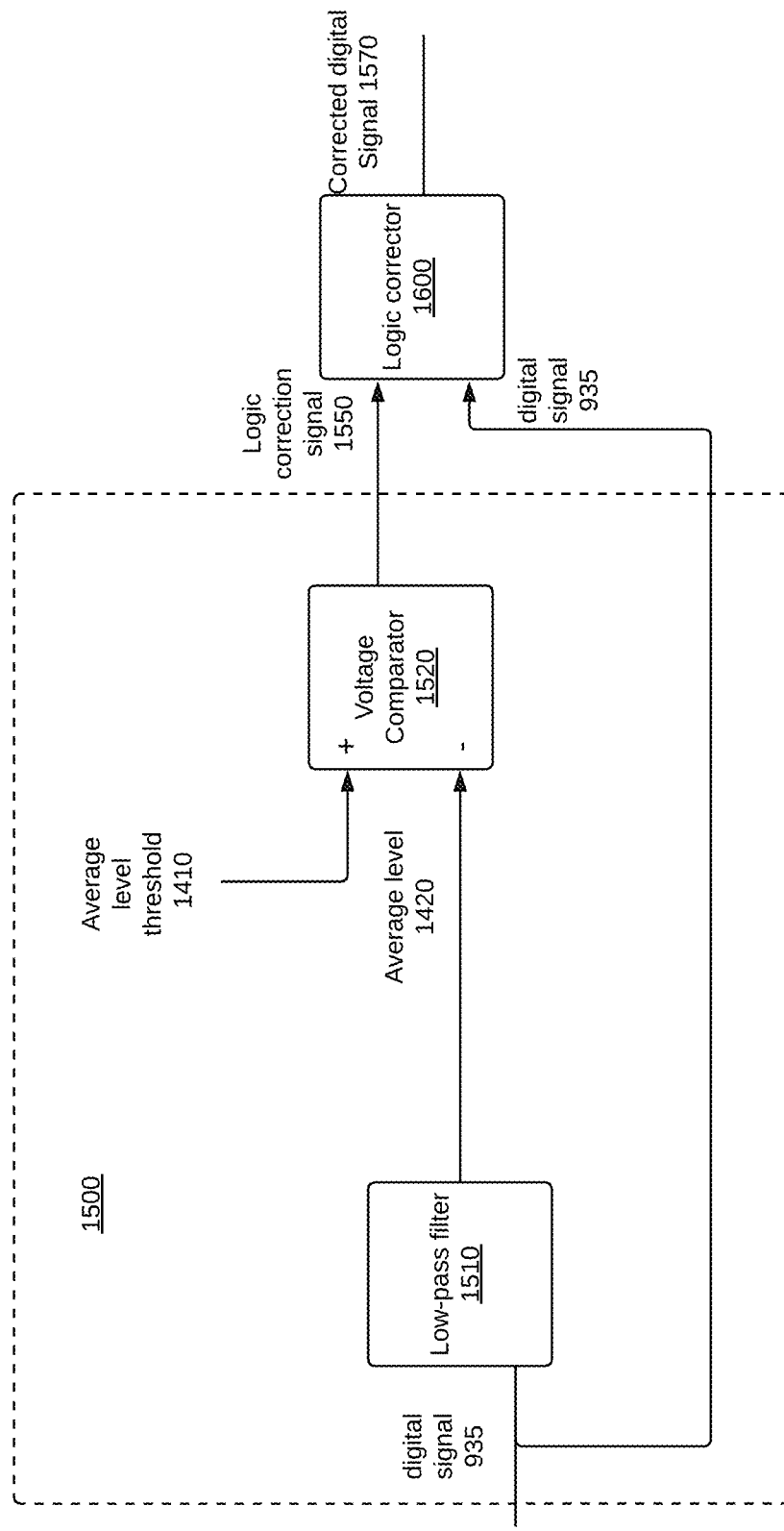
FIG. 15A is a simplified diagram depicting a high-level implementation of an orientation detector and a logic correction circuit, in accordance with embodiments of the present disclosure.
Figure 15B:
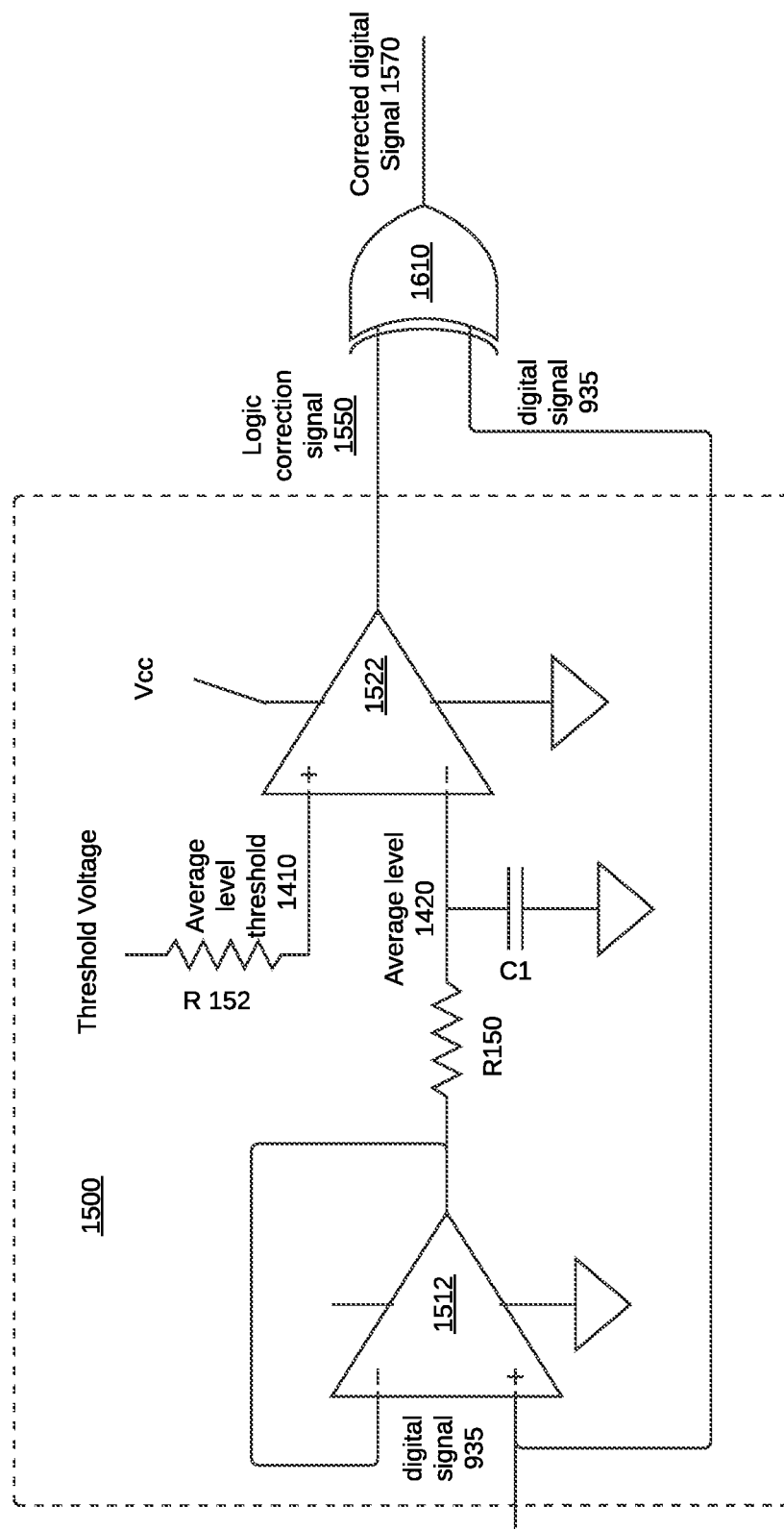
FIG. 15B is a simplified circuit diagram depicting an exemplary implementation of the orientation detection circuit and the logic correction circuit of FIG. 15A, in accordance with embodiments of the present disclosure.

FIG. 15A and FIG. 15B each depicts an orientation detector 1500 coupled to a logic corrector 1600 in accordance with embodiments of the present disclosure. The orientation detector 1500 determines whether the coupling clamp has been coupled to the CAN bus correctly, as in FIGS. 10C and 10D, or in a reverse manner, as in FIGS. 10A and 10B. The input to the orientation detector 1500 is the digital or UART-level signal 935 output by the level converter 930.

With reference to FIG. 15A, the orientation detector 1500 is comprised of a low-pass filter 1510 and a voltage comparator 1520. The digital signal 935 is passed through the low-pass filter 1510. The low-pass filter 1510 outputs an average level 1420 of the digital signal 935. The average level 1420 is compared against an average level threshold 1410 by the voltage comparator 1520. As discussed above, if the DC or average level 1420 of the UART-level signal 935 is above a particular threshold, then the UART-level signal 935 does not need to be inverted. The voltage comparator 1520 is configured to output a logic HIGH circuit if the average level 1420 is below the average level threshold 1410. Conversely, the voltage comparator 1520 is configured to output a logic LOW signal if the average level 1420 is above the average level threshold 1410. Accordingly, if the average level 1420 is below the average level threshold 1410, the logic correction signal 1550 is HIGH, and if the average level 1420 is above the average level threshold 1410, the logic correction signal 1550 is LOW.

The logic corrector 1600 accepts two inputs namely the logic correction signal 1550 and the digital signal 935. If the logic correction signal 1550 is HIGH, the logic corrector 1600 outputs a corrected digital signal 1570 that is the complement of the digital signal 935. Conversely, if the logic correction signal 1550 is LOW, the logic corrector 1600 outputs a corrected digital signal 1570 that is identical to the digital signal 935.

FIG. 15B depicts a specific implementation of the orientation detector 1500 of FIG. 15A. In this implementation, the low pass filter is represented by an RC circuit comprised of a resistor R150 and a capacitor C1. To prevent current loading through the RC filter consisting of the resistor R150 and the capacitor C1, the low-pass filter also has a buffer 1512 having a high input impedance upstream from the RC filter. The buffer 1512 is an op amp having feedback from the output to the inverting input, as known in the art. The UART-level signal 935 is applied to the buffer The output of the buffer is passed to the RC filter. The RC filter averages the UART-level signal 935 and provides an average level 1420. The orientation detector 1500 compares the average signal with an average signal threshold to determine whether the UART-level signal needs to be inverted. In the implementation of FIG. 15B, the voltage comparator 1520 (of FIG. 15A) is represented by an inverting comparator utilizing an op amp 1522. The average level 1420 is applied to the inverting input of the op amp 1522, after passing through a resistor R150. The average level threshold 1410 is applied to the non-inverting input of the op amp 1522. The output of the op amp 1522 is a logic correction signal 1550. If V+ is greater than V−, the logic correction signal 1550 is HIGH, where V− is greater than V+, the logic correction signal 1550 is LOW. Accordingly, if the average level 1420 is smaller than the average level threshold 1410, then the logic correction signal 1550 is HIGH. Conversely, if the average level 1420 is greater than the average level threshold 1410, then the logic correction signal 1550 is LOW.

FIG. 15B depicts an example of the logic corrector 1600 in the form of an exclusive OR (XOR) gate 1610. The XOR gate 1610 performs a XOR function between the UART-level signal 935 and the logic correction signal 1550. If the logic correction signal 1550 is HIGH (logic "1") then the corrected digital signal 1570 output by the XOR gate 1610 is the complement of the UART-level signal 935. This is because, as known in the art, A XOR 1=/A. Conversely, if the logic correction signal 1550 is LOW (logic "0"), then the corrected digital signal 1570 output by the XOR gate 1610 is the UART-level signal 935. This is because, as known in the art, A XOR 0=A.

The orientation detector 1500 of FIG. 15A and FIG. 15B and the logic corrector 1600 coupled thereto will now be discussed with reference to the UART-level signals of FIG. 14A and FIG. 14B.

With reference to FIG. 14A, the average level 1420 is lower than the average level threshold 1410. Accordingly, the voltage level at V− is lower than the voltage level at V+ and the logic correction signal 1550 is HIGH. As a result, the logic corrector 1600 outputs a corrected digital signal 1570 that is the complement of the UART-level signal 935.

With reference to FIG. 14B, the average level 1420 is higher than the average level threshold 1410. Accordingly, the voltage level at V− is higher than the voltage level at V+ and the logic correction signal 1550 is LOW. As a result, the logic corrector 1600 outputs a corrected digital signal 1570 that is the same as the UART-level signal 935.

Transceiver

The corrected digital signal 1570 is input into a transceiver 960. In some implementations, the transceiver 960 is a CAN transceiver which converts the corrected digital signal 1570 to a CAN signal. In this case, the output signal 980 is a CAN signal which may be provided to a host device such as a telematics device. In other implementations, the transceiver 960 is a serial protocol transceiver, such as a serial RS-232 transceiver, or a USB transceiver.

If the transceiver 960 is a CAN transceiver, then the transceiver 960 converts the corrected digital signal 1570 output by the logic corrector 1600 to CAN levels, such as the levels shown in FIG. 7. The coupling harness 900 may connect to the telematics device 201 via the I/O expander interface 250, which is a CAN interface, as shown in FIG. 8. It should be noted, however, that the coupling harness 900 cannot be connected to a CAN bus shared by another device. This is because the coupling harness 900 does not contain a controller by which it may synchronize access to a shared CAN bus based on the bus activity. For further clarity, the coupling harness 900 cannot connect to the downlink interface 320 of the I/O expander 300. The coupling harness must be connected directly to the I/O expander interface 250.

Figure 16:
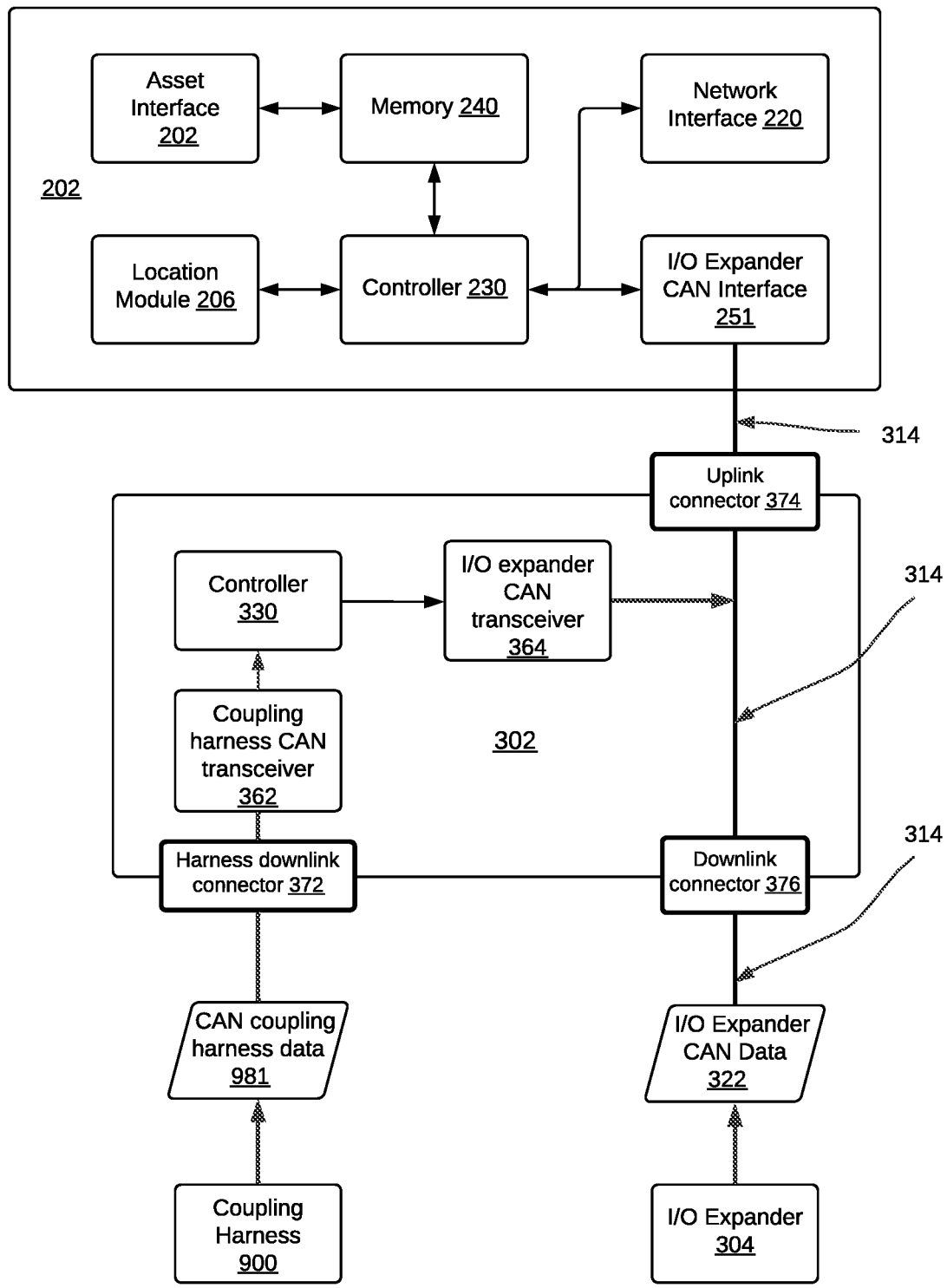
FIG. 16 is a block diagram depicting a system including an I/O expander configured for connecting to a coupling harness and other I/O expanders, in accordance with embodiments of the present disclosure.

A coupling harness 900 in which the transceiver 960 is a CAN transceiver can connect to an I/O expander having dedicated CAN transceivers and a controller for coordinating access with an I/O expander CAN bus. For example, with reference to FIG. 16, there is shown a system including a telematics device 202, a first I/O expander 302, a coupling harness 900, and a second I/O expander 304.

The telematics device 202 is similar to the telematics device 201 described in FIG. 3 with one minor difference. The I/O Expander interface 250 has been replaced with an I/O expander CAN interface 251 to clarify that the telematics device 202 uses the CAN protocol to connect to I/O expanders. The I/O expander CAN interface 251 is comprised of a CAN transceiver and a downlink connector for connecting I/O expanders to the telematics device 202. The CAN bus connecting the I/O expander CAN interface 251 to one or more I/O expanders is termed the I/O expander CAN bus 314, or sometimes referred to as the "external CAN bus" to distinguish it from the CAN bus which is internal to the vehicle to which the telematics device 202 is coupled, such as the CAN bus 104 of FIG. 2.

The I/O expander 302 is comprised of a controller 330, a coupling harness CAN transceiver 362 coupled to the controller 330, and an I/O expander CAN transceiver 364 coupled to the controller 330. The I/O expander 302 has a coupling harness downlink connector 372 that enables a coupling harness to connect to the coupling harness CAN transceiver 362. The I/O expander 302 also has an uplink connector 374 and a downlink connector 376 for connecting the I/O expander 302 to an I/O expander CAN bus 314. When connected to an I/O expander CAN bus 314, the I/O expander CAN bus 314 extends between the uplink connector 374 and the downlink connector 376. The uplink connector 374 connects the I/O expander 302 to the I/O expander CAN interface 251 of the telematics device 202. The downlink connector 376 allows connecting another I/O expander, such as the I/O expander 304.

The coupling harness 900 has been described above.

The I/O expander 304 is any I/O expander having a CAN interface, such as the I/O expander 300 described above.

When the I/O expander 302 is connected to the telematics device 202, and the I/O expander 304 is connected to the downlink connector 376 of the I/O expander 302, the I/O expander 304 can send I/O expander CAN data 322 to the telematics device 202 via the I/O expander CAN bus 314.

When the coupling harness 900 is connected to the I/O expander 302, via the coupling harness downlink connector, the coupling harness sends CAN coupling harness data 981 to the I/O expander 302 via the coupling harness connector. The CAN coupling harness data 981 is converted by the coupling harness CAN transceiver 362 to digital data (i.e., data having digital or UART-like voltage levels) that is received by the controller 330. To send the digital data corresponding to the CAN coupling harness data 981 to the telematics device 202, the controller 330 uses the I/O expander CAN transceiver 364 to monitor the I/O expander CAN bus 314 and determine when the digital data can safely be placed on the I/O expander CAN bus 314. When the controller 330 determines that the digital data can be sent to the telematics device 202 over the I/O expander CAN bus 314, the controller 330 passes the digital data to the I/O expander CAN transceiver 364 so that the digital data is converted to CAN signal levels and placed on the I/O expander CAN bus 314 where the telematics device 202 can receive such data.

In another implementation, the transceiver 960 is a serial communications transceiver such as an RS-232 transceiver or a USB interface module. In this case, the coupling harness 900 may connect to the telematics device 200 via the serial communications module 280. Alternatively, the coupling harness 900 may connect to the telematics device 201 via the I/O expander 300. In the latter case, the coupling harness 900 connects to the serial communications module 380 of the I/O expander 300. In this case, the I/O expander 300 processes the output signal 980, which may be an RS-232 signal or a USB signal, and transfers the data in CAN format, via the uplink interface 350, to the I/O expander interface 250. In the case of RS-232, the coupling harness 900 needs an external power source for power. In case of USB, the transceiver 960 comprises a USB interface module that requests USB power delivery from the host device to which the coupling harness is connected.

Power Rail

The coupling harness also includes a power rail 990. The power rail 990 receives power from the host device via a port of the coupling harness, and delivers power to the individual components of the coupling harness 900. The power rail 990 may include a filtering and/or protection component, as well as a voltage regulator such as a low dropout (LDO) regulator.

Advantageously, the coupling harness 900 described herein allows capturing CAN signals using capacitive coupling using a coupling clamp that may connect to CAN signal lines in any one of two possible orientations. The captured signal is logic-corrected based on the orientation which is automatically detected.

It has been observed that the average level threshold 1410 used in the orientation detector 1500 varies with the CAN bus occupancy. For example, as the CAN bus occupancy increases, it is expected the CAN bus will be at the recessive state (which is HIGH) less frequently. As a result, the average or DC values of the coupled signals will change. Accordingly, a safe average level threshold is established, the safe average level threshold covers bus occupancies that are common in the majority of vehicles. For example, the average level threshold may be selected such that the orientation detector can detect the cable orientation with respect to the capacitive clamp even in CAN buses having an occupancy of up to 85%.

Figure 17:
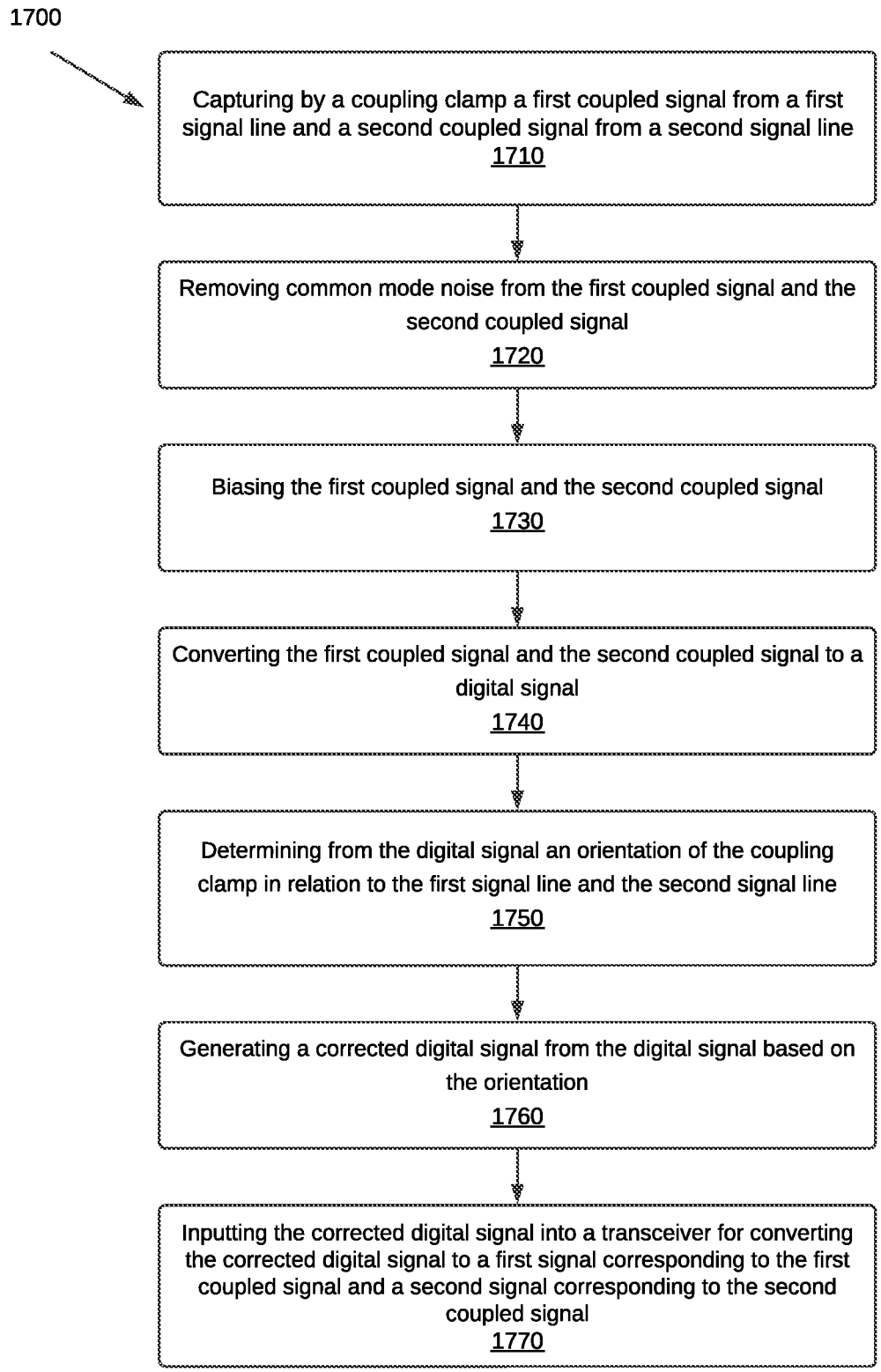
FIG. 17 is a flow chart depicting a method by a coupling harness, in accordance with embodiments of the present disclosure.

FIG. 17 depicts a method 1700 by a coupling harness, such as the coupling harness 900, in accordance with embodiments of the present disclosure.

At step 1710, the coupling harness captures, by a coupling clamp 1000, a first coupled signal from a first signal line and a second coupled signal from a second signal line. The first signal line and the second signal line carry a differential voltage signal. In some implementations, the first signal line and the second signal line are Controller Area Network signal lines. The first signal line carries one of a CANL signal and a CANH signal. The second signal line carries the other of the CANL signal and the CANH signal.

In some implementations, capturing the first coupled signal comprises coupling between a first coupling element in the coupling clamp and the first signal line and capturing the second coupled signal comprises coupling between a second coupling element in the coupling clamp and the second signal line. In some implementations, the coupling comprises capacitive coupling, the first coupling element comprises a left coupling conductor 1031, and the second coupling element comprises a right coupling conductor 1032.

If the first coupled signal and the second coupled signals are noisy, then the step 1720 is carried out. The step 1720 is optional depending on how noisy the first coupled signal and the second coupled signal are. At step 1720, common mode noise is removed from the first coupled signal and the second coupled signal. In some implementations, removing common noise is done by passing the first coupled signal and the second coupled signal through a common mode choke.

If the amplitude of the first coupled signal and the second coupled signal is small, then, at step 1730 the first coupled signal and the second coupled signal are biased to a higher voltage. Biasing the first coupled signal and the second coupled signal may be necessary if the level converter to which they are input has input transistors that need a higher turn on voltage. Biasing the first coupled signal and the second coupled signal may be done by connecting a voltage source through a resistor to each of the first coupled signal line 1041 and the second coupled signal line 1042. For example, the first coupled signal CAN_1 is biased by Vclamp through the resistor R3, while the second coupled signal CAN_2 is biased by Vclamp through the resistor Rb.

At step 1740, the first coupled signal and the second coupled signal are converted to a digital signal, also known as a UART-level signal. In some implementations, converting the first coupled signal and the second coupled signal to the digital signal comprises applying the first coupled signal to an inverting input of a first analog comparator, applying the second coupled signal to a non-inverting input of the first analog comparator, and taking an output of the first analog comparator to be the digital signal. For example, with reference to FIG. 11, the first coupled CAN signal CAN_1 is applied to V− of the op amp 932 which is configured as an analog comparator. Similarly, the second coupled CAN signal CAN_2 is applied to V+ of the op amp 932. The digital signal is taken as the output Vout of the op amp 932.

At step 1750, the coupling harness determines, from the digital signal, an orientation of the coupling clamp in relation to the first signal line and the second signal line. In some implementations, determining the orientation of the coupling clamp comprises obtaining an average level of the digital signal and comparing the average level 1420 to an average level threshold 1410. More specifically determining the orientation of the coupling clamp comprises determining that the orientation of the coupling clamp is a first orientation when the average level 1420 is smaller than the average level threshold 1410, and determining that the orientation of the coupling clamp is a second orientation when the average level 1420 is greater than the average level threshold 1410. Determining the orientation of the coupling clamp further comprises outputting a logic correction signal 1550 based on the orientation. In some implementations, obtaining the average level involves passing the digital signal through a low pass filter, such as the low pass filter comprising the buffer 1512 (in the form of an op amp), the resistor R150, and the capacitor C1. In some implementations, comparing the average level to the average level threshold involves inputting the average level to an inverting input of a second analog comparator, and inputting the average level threshold to a non-inverting input of the second analog comparator. For example, as shown in FIG. 15B, the average level threshold 1410 is input to V+ of the op amp 1522 and the average level 1420 is input to V− of the op amp 1522.

At step 1760, the coupling harness generates a corrected digital signal from the digital signal based on the orientation. In some implementations, generating the corrected digital signal from the digital signal based on the orientation comprises generating a logic inverted signal of the digital signal when the orientation is a first orientation and outputting the digital signal as the corrected digital signal when the orientation is a second orientation. For example, as shown in FIG. 15, when the logic correction signal is logic HIGH (representing a first orientation where the average level 1420 is lower than the average level threshold 1410) the digital signal 935 is XOR'd with "1" and as a result the corrected digital signal 1570 is a logic inverted signal of the digital signal 935. Conversely when the logic correction signal is logic LOW ("0") (representing a second orientation where the average level 1420 is higher than the average level threshold 1410) the digital signal 935 is XOR'd with "0" and as a result the corrected digital signal 1570 is the digital signal 935. In other words, the digital signal 935 is output as the corrected digital signal 1570.

At step 1770, the corrected output signal is input into a transceiver for converting the corrected digital signal to a first signal corresponding to the first coupled signal and a second signal corresponding to the second coupled signal. For example, the corrected digital signal 1570 is input into a transceiver 960 which outputs output signals. In some implementations, the transceiver 960 is a CAN transceiver which outputs CAN signals (CANH and CANL) that correspond to the coupled CAN signals CAN_1 and CAN_2. The output signals may be connected to a telematics device or an I/O expander as described above.

While the telematics device has been given in the context of use in vehicles, this is not necessarily the case. For example, the telematics device 200 may be used to capture asset data in any machine having an asset communications bus running a differential voltage signal.

Embodiments have been described where the techniques are implemented in circuitry and/or computer-executable instructions. It should be appreciated that some embodiments may be in the form of a method or process, of which at least one example has been provided. The acts performed as part of the method or process may be ordered in any suitable way. Accordingly, embodiments may be constructed in which acts are performed in an order different than illustrated, which may include performing some acts simultaneously, even though shown as sequential acts in illustrative embodiments. Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

The invention claimed is:

1. A method in a coupling harness, the method comprising:
producing, by a coupling clamp, a first coupled signal from a first signal line and a second coupled signal from a second signal line;
converting the first coupled signal and the second coupled signal to a digital signal;
determining, from the digital signal, an orientation of the coupling clamp in relation to the first signal line and the second signal line; and
generating a corrected digital signal from the digital signal based on the orientation.

2. The method of claim 1, further comprising biasing the first coupled signal and the second coupled signal prior to the converting.

3. The method of claim 1, further comprising inputting the corrected digital signal into a transceiver for converting the corrected digital signal to:
a first signal corresponding to the first coupled signal; and
a second signal corresponding to the second coupled signal.

4. The method of claim 1, wherein:
the first signal line and the second signal line are Controller Area Network (CAN) signal lines;
the first signal line carries one of a CAN Low (CANL) signal and a CAN High (CANH) signal; and
the second signal line carries another one of the CANL signal and the CANH signal.

5. The method of claim 1, wherein:
producing the first coupled signal comprises coupling between a first coupling element in the coupling clamp and the first signal line; and
producing the second coupled signal comprises coupling between a second coupling element in the coupling clamp and the second signal line.

6. The method of claim 1, wherein converting the first coupled signal and the second coupled signal to the digital signal comprises:
applying the first coupled signal to an inverting input of a first analog comparator;
applying the second coupled signal to a non-inverting input of the first analog comparator; and
taking an output of the first analog comparator to be the digital signal.

7. The method of claim 1, wherein determining the orientation of the coupling clamp comprises:
obtaining an average level of the digital signal; and
comparing the average level to an average level threshold.

8. The method of claim 7, wherein determining the orientation of the coupling clamp further comprises:
determining that the orientation of the coupling clamp is a first orientation when the average level is smaller than the average level threshold; and
determining that the orientation of the coupling clamp is a second orientation when the average level is greater than the average level threshold.

9. The method of claim 7, wherein determining the orientation of the coupling clamp further comprises outputting a logic correction signal based on the orientation.

10. The method of claim 7, wherein obtaining the average level comprises passing the digital signal through a low pass filter.

11. The method of claim 7, wherein comparing the average level to the average level threshold comprises:
inputting the average level to an inverting input of a second analog comparator; and
inputting the average level threshold to a non-inverting input of the second analog comparator.

12. The method of claim 1, wherein generating the corrected digital signal from the digital signal based on the orientation comprises:
generating a logic inverted signal of the digital signal when the orientation is a first orientation; and
outputting the digital signal as the corrected digital signal when the orientation is a second orientation.

13. A coupling harness, comprising:
a coupling clamp for capturing a first coupled signal from a first signal line and a second coupled signal from a second signal line;
a level converter for converting the first coupled signal and the second coupled signal to a digital signal;
an orientation detector for determining, from the digital signal, an orientation of the coupling clamp in relation to the first signal line and the second signal line; and
a logic corrector for generating a corrected digital signal from the digital signal based on the orientation.

14. The coupling harness of claim 13, further comprising a common mode noise remover for removing common mode noise from the first coupled signal and the second coupled signal.

15. The coupling harness of claim 13, wherein
the first signal line and the second signal line are Controller Area Network (CAN) signal lines;
the first signal line carries one of a CAN Low (CANL) signal and a CAN High (CANH) signal; and
the second signal line carries another one of the CANL signal and the CANH signal.

16. The coupling harness of claim 13, wherein the coupling clamp comprises:
a first coupling element for capturing the first coupled signal by coupling with the first signal line; and
a second coupling element for capturing the second coupled signal by coupling with the second signal line.

17. The coupling harness of claim 13, wherein:
the level converter comprises a first analog comparator having a positive feedback;
the first coupled signal is input into an inverting input of the first analog comparator;
the second coupled signal is input into a non-inverting input of the first analog comparator; and
the digital signal is taken at an output of the first analog comparator.

18. The coupling harness of claim 13, wherein the orientation detector comprises:
a filter to obtaining an average level of the digital signal; and
a second analog comparator for comparing the average level to an average level threshold.

19. The coupling harness of claim 13, wherein the orientation detector outputs a logic correction signal.

20. The coupling harness of claim 19, wherein the logic corrector comprises an exclusive OR gate having a first input connected to the logic correction signal and a second input connected to the digital signal.

* * * * *